(12) United States Patent
Nishihara et al.

(10) Patent No.: US 9,706,150 B2
(45) Date of Patent: Jul. 11, 2017

(54) IMAGE PICKUP DEVICE AND CAMERA SYSTEM WITH HIGH PRECISION AT HIGH SPEED PIXEL READ

(71) Applicant: Sony Corporation, Tokyo (JP)

(72) Inventors: Toshiyuki Nishihara, Kanagawa (JP); Hirofumi Sumi, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/797,852

(22) Filed: Jul. 13, 2015

(65) Prior Publication Data

US 2016/0191830 A1    Jun. 30, 2016

Related U.S. Application Data

(63) Continuation of application No. 14/349,573, filed as application No. PCT/JP2012/076614 on Oct. 20, 2011, now Pat. No. 9,100,603.

(30) Foreign Application Priority Data

Oct. 20, 2011  (JP) ................................ 2011-230672

(51) Int. Cl.
*H04N 3/14*  (2006.01)
*H04N 5/378*  (2011.01)
(Continued)

(52) U.S. Cl.
CPC ....... *H04N 5/378* (2013.01); *H01L 27/14603* (2013.01); *H04N 5/365* (2013.01); *H04N 5/374* (2013.01); *H04N 5/3765* (2013.01)

(58) Field of Classification Search
CPC ....... H03M 1/00–1/645; H04N 5/3355; H04N 5/3745; H04N 5/37455; H04N 5/378
See application file for complete search history.

(56) References Cited

U.S. PATENT DOCUMENTS

2011/0050969 A1* 3/2011 Nishihara ................ G01J 1/44
                                                        348/296
2012/0262614 A1* 10/2012 Deng ................... H03M 1/0641
                                                        348/302

FOREIGN PATENT DOCUMENTS

JP        07-067043      3/1995
JP      2006-020173      1/2006
(Continued)

*Primary Examiner* — Sinh Tran
*Assistant Examiner* — Selam Gebriel
(74) *Attorney, Agent, or Firm* — Chip Law Group

(57) ABSTRACT

Provided are an image pickup device and a camera system that are capable of detecting an extremely small signal from a pixel or one photon signal with low noise and high precision at high speed, and are capable of performing various kinds of high-performance shooting by increasing a frame rate with use of this. Each sense circuit includes a comparator configured to compare an output signal from a pixel with a reference signal, and when signal detection is performed, a charge allowing a first pixel signal output from a selected pixel to be cancelled out is held in one or both of input sections of the comparator, an independent offset bias for each comparator is applied to one of the input sections of the comparator to cancel out an offset of the comparator, and a digital decision on intensity of light incident on the pixel is performed by comparing a reference signal changing in steps with a second pixel signal output from the selected pixel.

8 Claims, 19 Drawing Sheets

(51) Int. Cl.
*H01L 27/146* (2006.01)
*H04N 5/365* (2011.01)
*H04N 5/374* (2011.01)
*H04N 5/376* (2011.01)

(56) References Cited

FOREIGN PATENT DOCUMENTS

| | | |
|---|---|---|
| JP | 2008-193373 | 8/2008 |
| JP | 2011-071958 A | 4/2011 |
| JP | 2011-097581 A | 5/2011 |
| WO | WO-2009/131018 A1 | 10/2009 |
| WO | WO-2010/137422 A1 | 12/2010 |

\* cited by examiner

FIG. 10
(A)
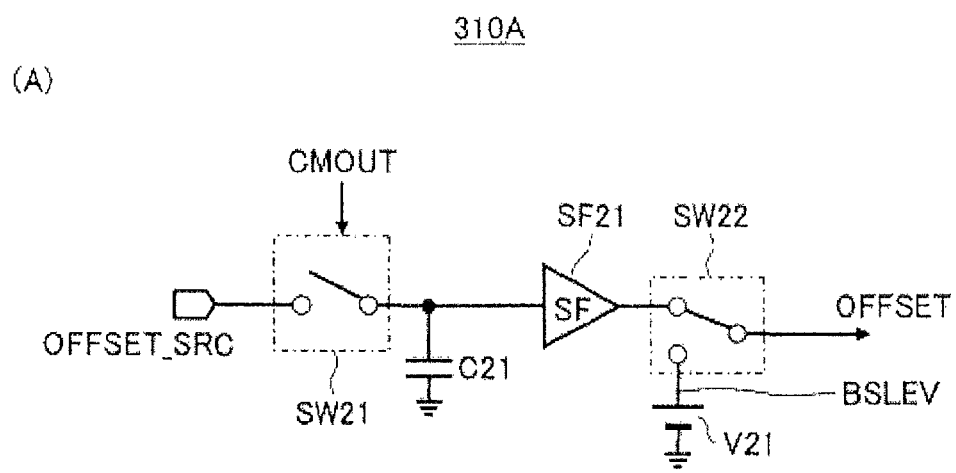
(B)
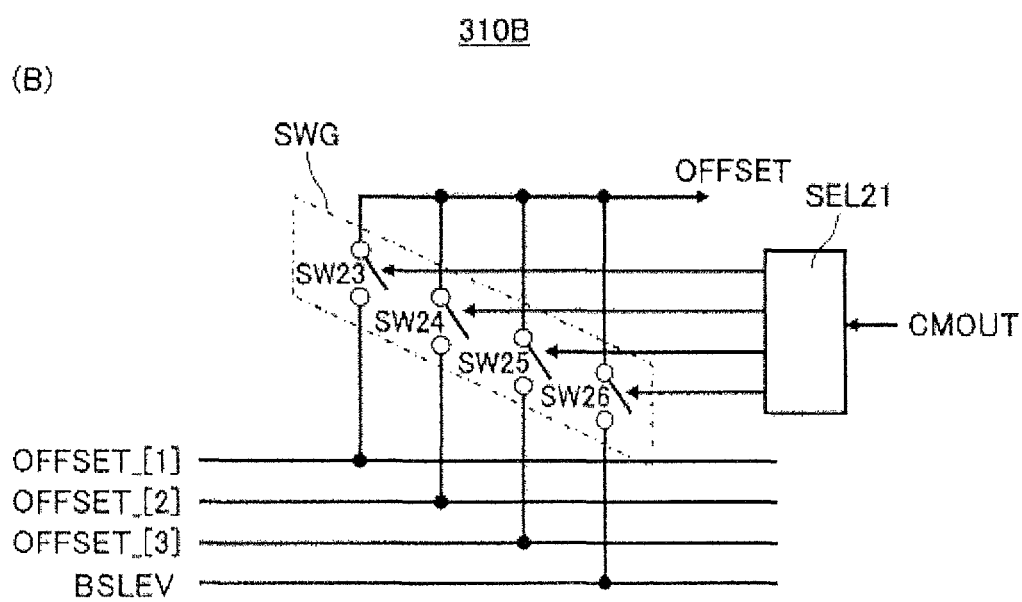

IMAGE PICKUP DEVICE AND CAMERA SYSTEM WITH HIGH PRECISION AT HIGH SPEED PIXEL READ

CROSS REFERENCES TO RELATED APPLICATIONS

This is a Continuation Application of the patent application Ser. No. 14/349,573, filed Apr. 3, 2014, which is based on a National Stage Application of PCT/JP2012/076614, filed Oct. 15, 2012, which in turn claims priority from Japanese Patent Application No.: 2011-230672, filed Oct. 20, 2011. The entire contents of these applications are incorporated herein by reference.

TECHNICAL FIELD

The present technology relates to an image pickup device such as a CMOS image sensor and a camera system.

BACKGROUND ART

Recently, CMOS image sensors have been widely used in digital still cameras, camcorders, surveillance cameras, and the like, and the market for the CMOS image sensors has been expanded. Each pixel in a CMOS image sensor converts incident light into electrons by a photodiode as a photoelectric conversion device, and accumulates the electrons for a certain period, and then outputs a signal corresponding to the amount of accumulated charge to an analog-digital (AD) converter contained in a chip. The AD converter digitalizes the signal, and then outputs the digitalized signal to a stage following the AD converter. In the CMOS image sensor, for image pickup, such pixels are arranged in a matrix form.

FIG. 1 is a diagram illustrating a typical chip configuration of a CMOS image sensor that is a solid-state image pickup device.

This CMOS image sensor 10 includes a pixel array section 11, a row drive circuit 12, AD converters 13, switches 14, an output circuit 15, row control lines 16, vertical signal lines 17, and a transfer line 18.

In the pixel array section 11, a plurality of pixels PX are arranged along a row direction and a column direction in a matrix form, and the vertical signal line 17 is shared by a plurality of pixels PX arranged along the column direction, and is connected to the AD converter 13 arranged corresponding to each column. On the other hand, the row drive circuit 12 selects only one row from a plurality of rows, and drives the row control line 16 to read the accumulated charges from the pixels PX in the selected row. The row control line 16 is configured of one or a plurality of control lines to execute such reading from the pixels or resetting of the pixels. As used herein, the term "resetting" refers to an operation in which the accumulated charges are discharged from the pixels to return the pixels to a state before exposure, and, for example, the resetting may be executed as a shutter operation immediately after reading from each row or when exposure starts. At the time of reading, analog signals transmitted to the AD converter 13 through the vertical signal line 17 are converted into digital signals, and the digital signals are sequentially transmitted to the output circuit 15 through the switch 14 to be output to an image processing unit located inside or outside the chip that is not illustrated.

When the CMOS image sensor 10 completes reading from one row in such a manner, a next row is selected, and reading, AD conversion, and outputting are repeated in a similar manner. When processing on all of the rows is completed, outputting of one frame of image data is completed.

On the other hand, PTL 1 has proposed a novel technique of counting photons in a time-divisional manner. In the counting technique, a binary decision as to whether or not a photon is incident on a photodiode in a certain period is repeatedly performed a plurality of times, and results of the binary decisions are integrated to obtain two-dimensional image pickup data. In other words, a signal from the photodiode in each certain period (each unit exposure period) is sensed, and when one or more photons are incident on the photodiode in the period, a counter connected to each pixel counts up by 1 irrespective of the number of incident photons. If the frequency of photon incidence is random along a time axis, the actual number of incident photons and the number of counts follow the Poisson distribution; therefore, when the frequency of incidence is low, the actual number of incident photons and the number of counts have a substantially linear relationship, and when the frequency of incidence is high, an output is compressed.

Moreover, PTL 2 has proposed a technique of improving an aperture ratio of pixels by separating a sense circuit and a counter circuit for the above-described time-divisional photon counting from the pixels and hierarchically arranging them.

An image sensor using such time-divisional photon counting consistently treats data output from the pixels as digital data; therefore, random noise and fixed noise associated with transmission and amplification of analog signals are not generated. At this time, only light shot noise and a dark current generated in the pixels remain, and a remarkably high S/N ratio is allowed to be obtained specifically in image pickup at low illuminance.

CITATION LIST

Patent Literature

[PTL 1] Japanese Unexamined Patent Application Publication No. H7-67043
[PTL 2] Japanese Unexamined Patent Application Publication No. 2011-71958
[PTL 3] Japanese Unexamined Patent Application Publication No. 2008-193373
[PTL 4] Japanese Unexamined Patent Application Publication No. 2006-20173

SUMMARY

Technical Problem

Recently, as a technique of AD conversion in the above-described CMOS image sensor, so-called single-slope conversion in which a plurality of pixel columns are connected to a plurality of AD converters, and the AD converters simultaneously perform AD conversion by comparing each of outputs of respective pixels with a common reference signal while changing the common reference signal in stair-steps has been mainstream. In particular, in detection of an extremely small pixel signal, such as image pickup at low illuminance and photon counting, reduction in random noise and fixed noise is desired; therefore, mainly two kinds of noise cancellation are necessary.

One of the kinds of noise cancellation is cancellation of reset noise of a pixel. This cancellation is executed by outputting a reset signal from a pixel, and then holding a charge that is to cancel out the signal in an input section of a comparator, and is called DCS (correlated double sampling). The other kind of noise cancellation is cancellation of offset noise generated on a comparator side. In a typical image sensor, the offset noise appears in an image as a vertical line, and may be handled in a following image processing stage; however, in photon counting, it is necessary to cancel out the offset noise before a binary decision on a pixel signal.

For example, in PTL 3, CDS of the reset signal from the pixel is substantially executed in a process called "auto-zero", and first application of a stepped pulse and down counting that are to be performed subsequently are processes for cancelling out offset noise and random noise on the comparator side. In the out-zero process, offset adjustment on the comparator is also performed; however, at this time, a remaining offset component is present. This remaining offset component is detected by AD conversion on a no-signal that is to be performed subsequently, and is subtracted from a result of AD conversion on the pixel signal to be cancelled out and removed almost completely.

In this technique, when a step width of a reference signal is narrowed in the above-described AD conversion to increase resolution, noise is allowed to be cancelled out with extremely high precision; therefore, this technique is superior in detection of an extremely small signal. Moreover, when a threshold value is provided, and a decision on an AD conversion result as binary data is performed, this technique may be also used as a sense circuit for time-divisional photon counting.

Alternatively, in PTL 4, calibration of an offset of a comparator is executed on each frame with use of a dark signal of a light-shielded pixel. In pixel reading, reading of a pixel signal and AD conversion are executed subsequently to the CDS of the reset signal, and an offset is cancelled out by obtaining a difference between the pixel signal and a calibration result from each comparator. Calibration on each frame has an issue that random noise generated on the comparator side is not allowed to be cancelled out; however, a process of cancelling out offset noise of the comparator is allowed to be shortened to some extent.

However, in a case where the pixel signal is extremely small, the above-described techniques have the following issue. For example, a case where the conversion efficiency is increased to 600 µV/e−, and a binary decision as to whether or not one photon is incident is performed is considered. At this time, the pixel signal has 600 µV, and a threshold decision value is about 300 µV; therefore, ideally, a decision is allowed to be performed by covering such a width with the reference signal and changing the reference signal in steps. However, the offset of the comparator has a few µV to ten-odd µV. In other words, in such a case, the offset on the comparator side is an order or more of magnitude larger than the pixel signal.

It is also necessary to detect the offset on the comparator side with precision equivalent to that when the pixel signal is detected. Therefore, in the above-described examples, most of time spent on reading decision on the pixel signal is occupied by time to sweep the offset of the comparator by the reference signal. For example, in the former example, it is necessary to sweep the offset twice in a single round of reading of the pixel signal, and in the latter case, it is necessary to sweep the offset once in a single round of reading of the pixel signal. However, several proposals for reduction in time to sweep the reference signal with respect to the pixel signal have been made, but reduction in time to sweep the offset on the comparator side has been hardly considered.

The present technology is made to provide an image pickup device and a camera system that are capable of performing detection of an extremely small signal from a pixel or one photon signal with less noise and high precision at high speed, and are capable of performing various kinds of high-performance shooting by increasing a frame rate with use of this.

Solution to Problem

A solid-state image pickup device according to a first aspect of the present technology includes: a pixel array section including a plurality of pixels arranged in an array, each of the pixels including a photoelectric conversion device, a storage section configured to accumulate a charge generated by photoelectric conversion, and an amplifier device configured to output the accumulated charge as an electrical signal, each of the pixels configured to output an electrical signal to an output signal line in response to photon incidence; a sense circuit section including sense circuits, each of the sense circuits configured to perform a process of detecting a pixel signal from the pixel; and a drive section configured to perform reading of a first pixel signal and reading of a second pixel signal from a selected pixel in reading, in which the first pixel signal and the second pixel signal are one and the other of a reset signal of a pixel corresponding to a no-signal accumulation state and an accumulation signal reflecting an accumulated charge generated by photoelectric conversion, in the sense circuit section, each of the sense circuits includes a comparator configured to compare an output signal from the pixel with a reference signal, and when signal detection is performed, a charge allowing the first pixel signal output from the selected pixel to be cancelled out is held in one or both of input sections of the comparator, an independent offset bias for each comparator is applied to one of the input sections of the comparator to cancel out an offset of the comparator, and a digital decision on intensity of light incident on the pixel is performed by comparing a reference signal changing in steps with the second pixel signal output from the selected pixel.

A camera system according to a second aspect of the present technology is provided with an image pickup device, an optical system, and a signal processing circuit, the optical system configured to form an image of a subject on the image pickup device, the signal processing circuit configured to process an output image signal of the image pickup device, the image pickup device including: a pixel array section including a plurality of pixels arranged in an array, each of the pixels including a photoelectric conversion device, a storage section configured to accumulate a charge generated by photoelectric conversion, and an amplifier device configured to output the accumulated charge as an electrical signal, each of the pixels configured to output an electrical signal to an output signal line in response to photon incidence; a sense circuit section including sense circuits, each of the sense circuits configured to perform a process of detecting a pixel signal from the pixel; and a drive section configured to perform reading of a first pixel signal and reading of a second pixel signal from a selected pixel in reading, in which the first pixel signal and the second pixel signal are one and the other of a reset signal of a pixel corresponding to a no-signal accumulation state and an accumulation signal reflecting an accumulated charge generated by photoelectric conversion, in the sense circuit section, each of the sense circuits includes a comparator configured to compare an output signal from the pixel with a reference signal, and when signal detection is performed, a charge allowing the first pixel signal output from the selected pixel to be cancelled out is held in one or both of input sections of the comparator, an independent offset bias for each comparator is applied to one of the input sections of the comparator to cancel out an offset of the comparator, and a digital decision on intensity of light incident on the pixel is performed by comparing a reference signal changing in steps with the second pixel signal output from the selected pixel.

Advantageous Effects of Invention

According to the present technology, an extremely small signal from a pixel or one photon signal is allowed to be detected with low noise and high precision at high speed, and various kinds of high-performance shooting are allowed to be performed by increasing a frame rate with use of this.

BRIEF DESCRIPTION OF DIAGRAMS

FIG. 10 is a diagram illustrating configuration examples of offset bias generation circuits configured to generate an offset bias according to the embodiment.

DESCRIPTION OF EMBODIMENTS

Some embodiments of the present disclosure will be described below referring to the accompanying drawings. It is to be noted that description will be given in the following order.

Figure 3:
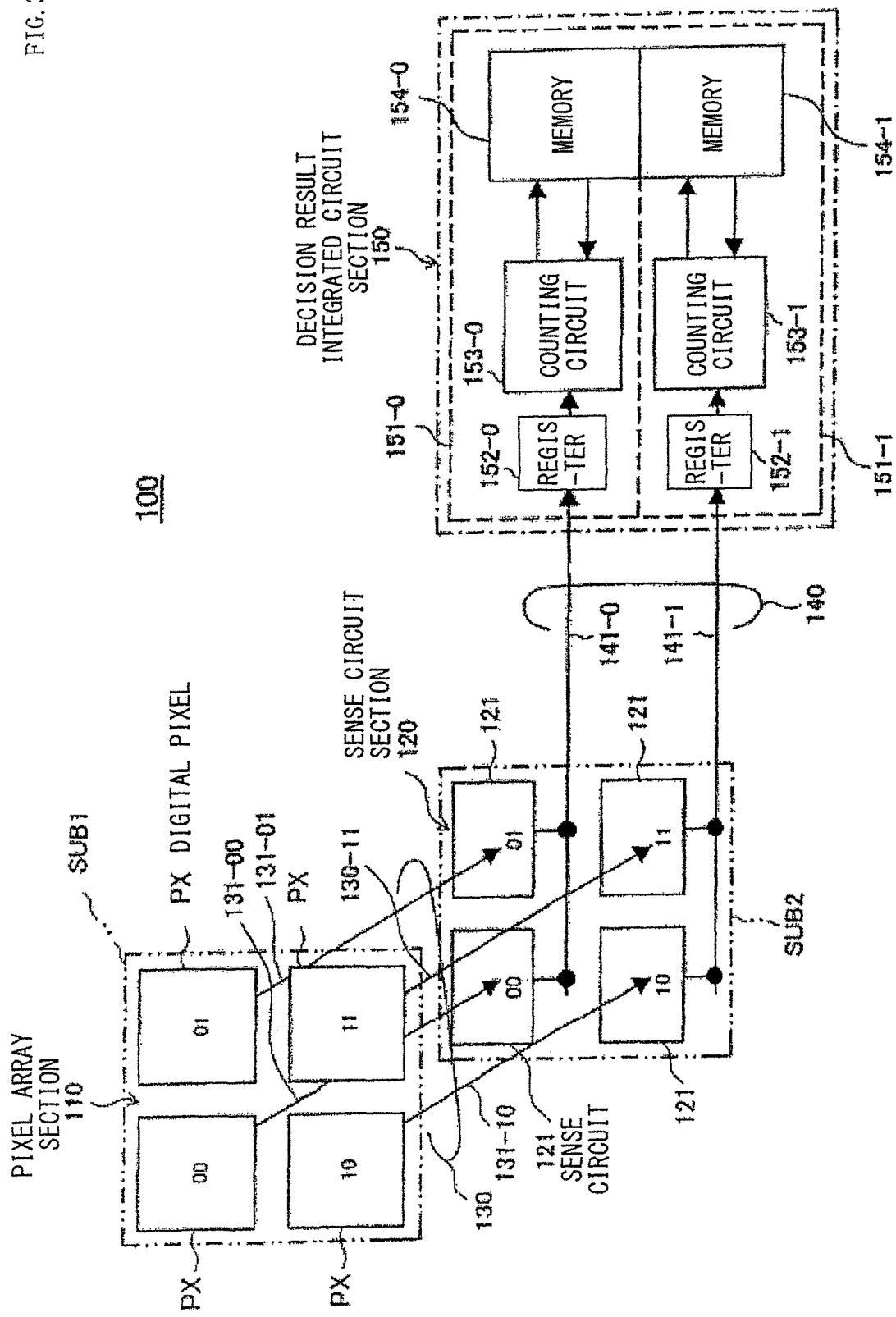
FIG. 3 is a diagram illustrating a configuration example of a CMOS image sensor (image pickup device) according to a first embodiment.

1. First Embodiment (First configuration example of image pickup device)
2. Second Embodiment (Second configuration example of image pickup device)
3. Configuration Example of Camera System 1. First Embodiment FIG. 3 is a diagram illustrating a configuration example of a CMOS image sensor (image pickup device) according to a first embodiment.

[Summary of Entire Configuration]

This CMOS image sensor 100 includes a pixel array section 110, a sense circuit section 120, an output signal line group 130, a transfer line group 140, and a decision result integrated circuit section 150.

The pixel array section 110 includes a plurality of digital pixels PX arranged along a row direction and a column direction in a matrix form. Each of the digital pixels PX includes a photoelectric conversion device, and has a function of outputting an electrical signal in response to photon incidence. The pixel array section 110 is formed on, for example, a first semiconductor substrate SUB1.

The sense circuit section 120 is formed on a second semiconductor substrate SUB2 that is different from the first semiconductor substrate SUB1. In the sense circuit section 120, a plurality of sense circuits are arranged, for example, along the row direction and the column direction in a matrix form so as to correspond to the plurality of pixels PX arranged in the matrix form of the pixel array section 110 on a one-to-one basis. Each of the sense circuits 121 has a function of performing binary decision as to whether or not a photon is incident on the digital pixel PX in a predetermined period upon reception of a signal from the digital pixel PX.

Then, the first semiconductor substrate SUB1 and the second semiconductor substrate SUB2 are laminated. For example, the first semiconductor substrate SUB1 and the second semiconductor substrate SUB2 are laminated so as to allow the plurality of pixels PX formed on the first semiconductor substrate SUB1 and the plurality of sense circuits 121 formed on the second semiconductor substrate SUB2 to face each other on a one-to-one basis. The pixels PX and the sense circuits 121 facing each other are connected to each other through respective output signal lines 131 of the output signal line group 130.

In an example in FIG. 3, an output of a pixel PX-00 located in a 0th row and a 0th column is connected to an input of a sense circuit 121-00 located in a 0th row and a 0th column through an output signal line 131-00. An output of a pixel PX-01 located in the 0th row and a first column is connected to an input of a sense circuit 121-01 located in the 0th row and a first column through an output signal line 131-01. An output of a pixel PX-10 located in a first row and the 0th column is connected to an input of a sense circuit 121-10 located in a first row and the 0th column through an output signal line 131-10. An output of a pixel PX-11 located in the first row and the first column is connected to an input of a sense circuit 121-11 located in the first row and the first column through an output signal line 131-11. Although not illustrated, the pixels and the sense circuits located in other rows and columns are connected to each other in a similar manner.

In the sense circuit section 120, outputs of the sense circuits 121 located in a same row are connected to a common transfer line 141. In the example in FIG. 3, outputs of the sense circuits 121-00, 121-01, . . . arranged in the 0th row are connected to a transfer line 141-0. Outputs of the sense circuits 121-10, 121-11, . . . located in the first row are connected to a transfer line 141-1. Although not illustrated, the sense circuits in second and later rows are formed in a similar manner.

In this embodiment, as will be described in detail later, each of the sense circuits 121 of the sense circuit section 120 includes an AD conversion device including a comparator configured to compare a signal read from a pixel with a reference signal REF.

The decision result integrated circuit section 150 has a function of integrating decision results from each pixel by the sense circuit 121 a plurality of times to generate two-dimensional image pickup data with a gray scale. In the decision result integrated circuit section 150, decision result integrated circuits 151-0, 151-1, . . . are arranged corresponding to row arrangement of the sense circuits 121 in the sense circuit section 120. In other words, the decision result integrated circuit 151-0 is connected to a transfer line 141-0 to which the sense circuits 121-00, 121-01, . . . located in the 0th row are connected. The decision result integrated circuit 151-1 is connected to a transfer line 141-1 to which the sense circuits 121-10, 121-11, . . . located in the first row are connected.

The decision result integrated circuit 151-0 includes a register 152-0 configured to hold a decision value transferred through the transfer line 141-0, a counting circuit 153-0 configured to count the value held by the register 152-0, and a memory 154-0 configured to hold a counting result by the counting circuit 153-0. The decision result integrated circuit 151-1 includes a register 152-1 configured to hold a decision value transferred through the transfer line 141-1, a counting circuit 153-1 configured to count the value held by the register 152-1, and a memory 154-1 configured to hold a counting result by the counting circuit 153-1. In this embodiment, the counting circuit 153-0 of the decision result integrated circuit 151-0 is shared by the plurality of sense circuits 121-00, 121-01, . . . . The counting circuit 153-1 of the decision result integrated circuit 151-1 is shared by the plurality of sense circuits 121-10, 121-11, . . . .

[Configuration Example of Pixel]

As described above, each of the pixels PX includes the photoelectric conversion device and an amplifier device, and outputs an electrical signal in response to photon incidence. The CMOS image sensor 100 as an image pickup device has a function of resetting the pixels PX and a function of reading from the pixels PX, and is allowed to execute resetting and reading at an arbitrary timing. In the resetting, the pixels PX are reset to a state in which a photon is not incident thereon. Each of the pixels PX may preferably include a lens and a color filter on a light reception surface thereof. An example of the configuration of the pixel will be described below.

Figure 4:
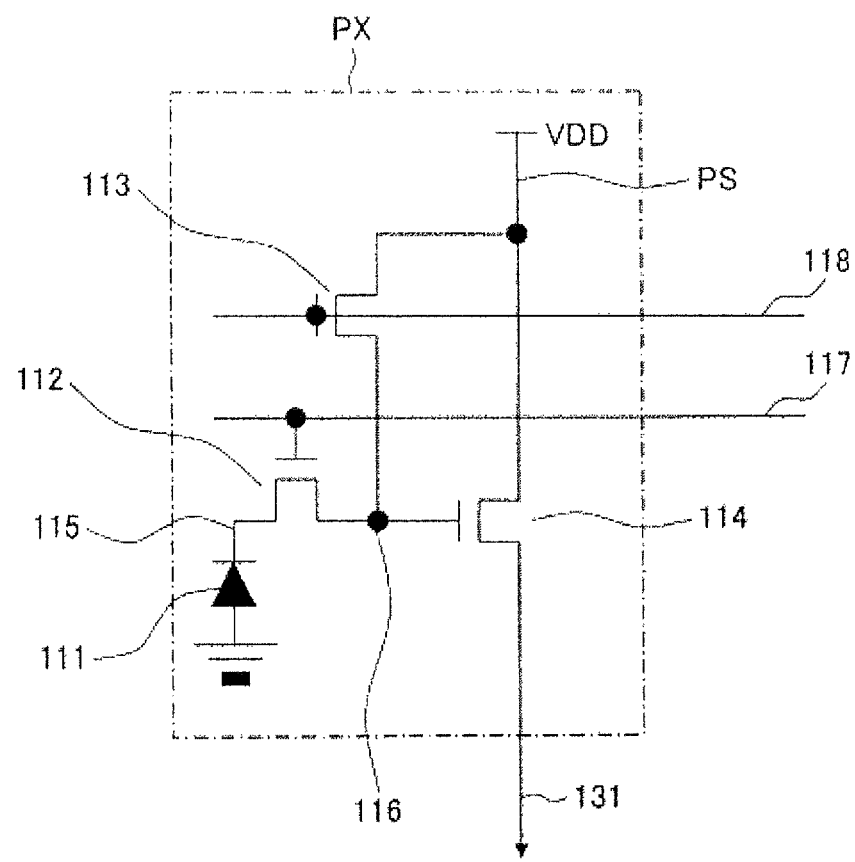
FIG. 4 is a diagram illustrating an example of a circuit configuration of a pixel according to the first embodiment.

FIG. 4 is a diagram illustrating an example of a circuit configuration of the pixel according to this embodiment. FIG. 4 illustrates an example of a pixel circuit in which one unit pixel PX includes three transistors.

One unit pixel PX includes a photodiode 111 as a photoelectric conversion device, a transfer transistor 112, a reset transistor 113, and an amplifier transistor 114 as an amplifier device. The pixel PX includes a storage node 115 and a floating diffusion (FD) node 116.

A gate electrode of the transfer transistor 112 is connected to a transfer line 117, and a gate electrode of the reset transistor 3 is connected to a reset line 118. A gate electrode of the amplifier transistor 114 is connected to the FD node 116, and a source of the amplifier transistor 114 is connected to an output signal line 131. The FD node 116 functions as an input node of the amplifier transistor 114.

In the pixel PX, light incident on a silicon substrate of the pixel generates electron-hole pairs, and electrons in the pairs are accumulated in the node 115 by the photodiode 111. When the transfer transistor 112 is turned on at a predetermined timing, the electrons are transferred to the node 116 to drive a gate of the amplifier transistor 114. Thus, a signal charge is read as a signal to the output signal line 131.

The output signal line 131 may be grounded through a constant current source or a resistor device to perform a source follower operation, or may be temporarily grounded before reading and then be turned to a floating state to output a charge level by the amplifier transistor 114.

The reset transistor 113 is turned on concurrently with turning on of the transfer transistor 112 to draw the electrons accumulated in the photodiode 111 to a power supply, thereby resetting the pixel to a dark state before accumulation, i.e., a state in which a photon is not incident thereon. It is to be noted that, in FIG. 4, PS represents a power supply used for resetting and a source follower, and, for example, 3 V may be supplied to the power supply PS.

A basic circuit or an operation mechanism (a drive section) of such a pixel PX is similar to a typical pixel, and the pixel PX may have variations. However, the pixel assumed in this embodiment is designed to have extremely high conversion efficiency, compared to the typical pixel. To do so, parasitic capacity of the input node 116 of the amplifier transistor 114 configuring a source follower may be preferably as small as possible, and an output signal obtained from one photon may be preferably sufficiently larger than random noise of the amplifier transistor 114.

Figure 5:
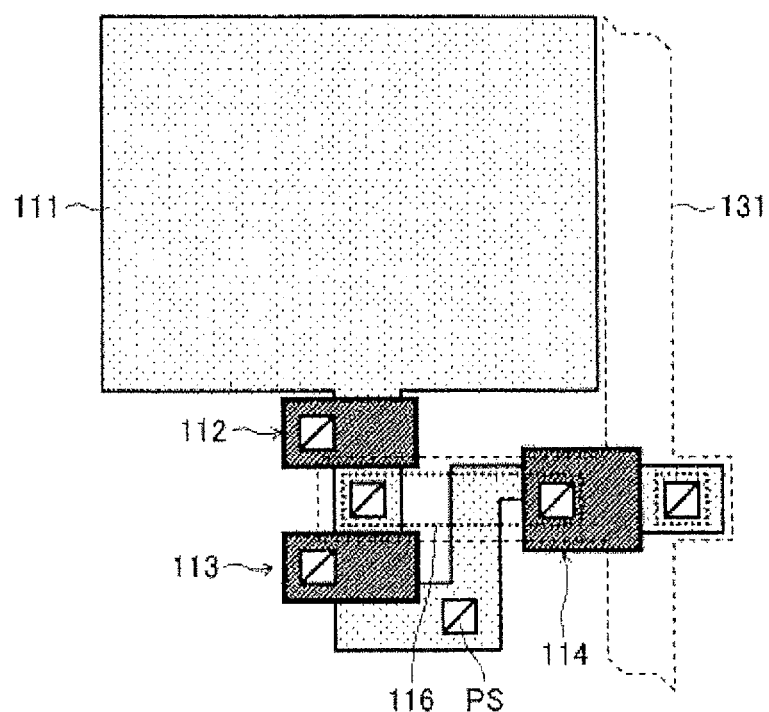
FIG. 5 is a diagram illustrating an example of a pixel layout.

FIG. 5 is a diagram illustrating an example of a pixel layout. In FIG. 5, a diagonal line represents a gate electrode of a transistor, and a broken line represents a metal wiring line.

The input node 116 of the amplifier transistor 114 is configured of a diffusion layer section sandwiched between the transfer transistor 112 and the reset transistor 113, a gate section of the amplifier transistor 114, and a wiring section between them; however, each of these sections is arranged so as to have a minimum area. Moreover, while a drain width of the amplifier transistor 114 is reduced, a most part of the node 116 is flatly covered with a wiring line connected to the signal line 131 as a source output. Since an output (on the signal line 131 side) of the source follower has a gain close to 1 with respect to an input from the input node 116, substantial parasitic capacity between them is extremely small. Therefore, the parasitic capacity of the node 116 is minimized by adopting such a shield configuration, and conversion efficiency is allowed to be largely increased.

For example, in a case where the conversion efficiency is increased to 600 μV/e−, a signal amount is sufficiently larger than random noise of the amplifier transistor 114, and accordingly, one photon is allowed to be detected in principle. In this case, when binary decision as to whether or not a photon is incident in a unit exposure period is performed to perform time-divisional photon counting, noise generated in the amplifier transistor 114 and the following devices is allowed to be reduced to substantially zero.

Alternatively, such a pixel is allowed to accumulate a charge of about 1000 e− in a photodiode (1), for example, with a power supply voltage of about 3 V. Although an output at this time is an analog output with an operation range of 0.6 V, a signal per electron is about ten times larger than that in related art; therefore, an influence of random noise on the amplifier transistor 114, a detector, or the like is reduced to 1/10, and the pixel is suitable for image pickup at low illuminance.

In other words, as long as the conversion efficiency is sufficiently high, the output of such a pixel PX containing the photoelectric conversion device and the amplifier device may be treated as binary data or analog data with a gray scale. On the other hand, in these pixels, an upper limit of a detected light amount in a single round of image pickup is small. In other words, there is an issue in a dynamic range of image pickup. To improve this, it is effective to integrate results of a plurality of rounds of reading while increasing reading speed of the pixel signal to increase a frame rate. For example, when results of binary decisions by performing exposure and reading 1023 times are integrated, a 10-bit gray scale is obtained. Moreover, even in a case where the maximum number of accumulated electrons is 1000 e−, integration of results by performing exposure and reading 16 times is equivalent to accumulation of 16000 e−.

Figure 6:
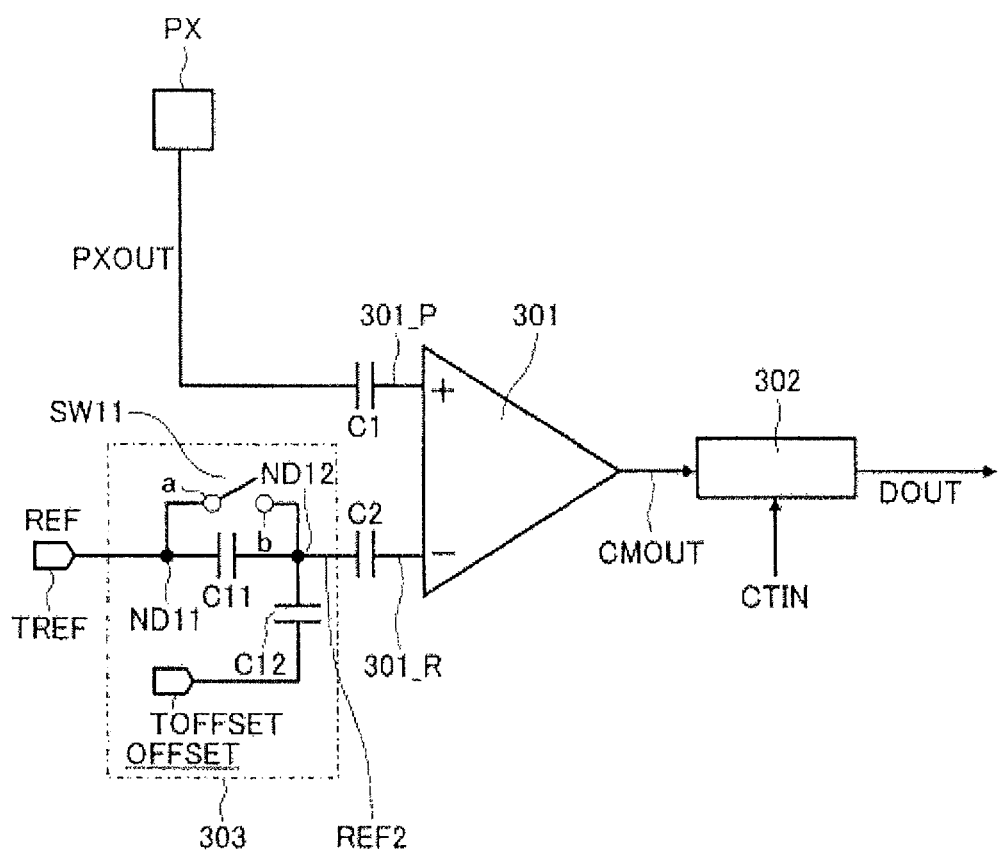
FIG. 6 is a diagram illustrating a configuration example of an AD conversion device in a sense circuit according to the first embodiment.

FIG. 6 is a diagram illustrating a configuration example of the AD conversion device in the sense circuit according to the first embodiment.

This AD conversion device 300 includes a comparator 301, a counter 302, an offset bias application section 303, a reference terminal TREF for input of a reference signal FRF, and capacitors C1 and C2.

The offset bias application section 303 is configured of a switch SW11, capacitors C11 and C12, an offset terminal TOFFSET to which an offset bias OFFSET is applied, and nodes ND11 and ND12.

In the comparator 301, a non-inverting input terminal (+) is connected to an output signal line 131 where a pixel signal PXOUT is output from a single pixel PX with the capacitor C1 in between. In the comparator 301, an inverting input terminal (−) is connected to the node ND12 of the offset bias application section 303 located on a supply line of the reference signal REF with the capacitor C2 in between. The counter 302 is cascaded to an output of the comparator 301. In the offset bias application section 303, the node ND11 is connected to the supply line of the reference signal REF, and the capacitor C11 is connected between the node ND11 and the node ND12. Moreover, terminals a and b of the switch SW11 are connected between the node ND11 and the node ND12 so as to allow the capacitor C11 to be bypassed.

Further, the capacitor C12 is connected between the offset terminal TOFFSET and the node ND12.

The comparator 301 compared the pixel signal PXOUT with the reference signal REF.

The counter 302 has a clock gate function, i.e., a function of blocking a clock CTIN therein upon reception of an output CMOUT from the comparator 301 to stop counting. In the AD conversion device 300 according to this embodiment, the offset bias application section 303 that applies an offset bias specific to each comparator 301 is added to an input terminal (inverting input terminal) for the reference signal REF of the comparator 301.

In principle, the CMOS image sensor 100 including the sense circuits 121 provided with the comparators 301 in such a manner executes signal detection by the following processes.

(1-1) process: First, a first signal PXOUT1 is output from a selected pixel PX.

(1-2) process: Next, a charge allowing the first pixel signal PXOUT1 to be cancelled out is held in one or both of input sections of the comparator 301.

(1-3) process: Next, an independent offset bias for each comparator 301 is applied to one of the input sections of the comparator 301 so as to cancel out an offset of the comparator 301.

(1-4) process: Next, a second pixel signal PXOUT2 is output from the selected pixel.

(1-5) process: Finally, the second pixel signal PXOUT2 is compared with the reference signal REF while changing the reference signal REF in steps, and a digital decision on intensity of light incident on the pixel is performed. The digital decision is a binary decision as to whether or not a photon is incident.

It is to be noted that the above-described first pixel signal PXOUT1 and the above-described second pixel signal PXOUT2 are one and the other of a reset signal of a pixel corresponding to a no-signal accumulation state and an accumulation signal reflecting an accumulated charge generated by photoelectric conversion.

In the CMOS image sensor 100 according to this embodiment, the offset bias is derived by the following order of calibration in each comparator 301.

(2-1) process: First, a predetermined signal is applied to each of an input section for the pixel signal and an input section for the reference signal REF.

(2-2) process: Next, a charge allowing a difference between the above-described signals to be cancelled out is held in one or both of the input sections of the comparator 301, and (2-3) process: both of the input signals are compared with each other while applying an offset bias in a plurality of steps to one of the input sections of the comparator 30, thereby determining an offset bias for each comparator.

Moreover, in the CMOS image sensor 100 according to this embodiment, in the above-described (1-3) and (1-5) processes, the following processing may be performed. In the (1-3) process, after the offset bias is applied, a reference potential is swept in steps to measure an inverting timing for the comparator. Then, in a decision process in the (1-5) process, the reference potential is swept in the same steps to measure an inverting timing for the comparator 301, and light intensity is derived from a difference between the inverting timings.

In the AD conversion device 300 including the comparator 301, to reduce or eliminate sweep time for the offset of the comparator 301 by the reference signal REF, a bias for cancellation of an offset specific to each comparator 301 is applied to an input on one side of each comparator 301.

Figure 7:
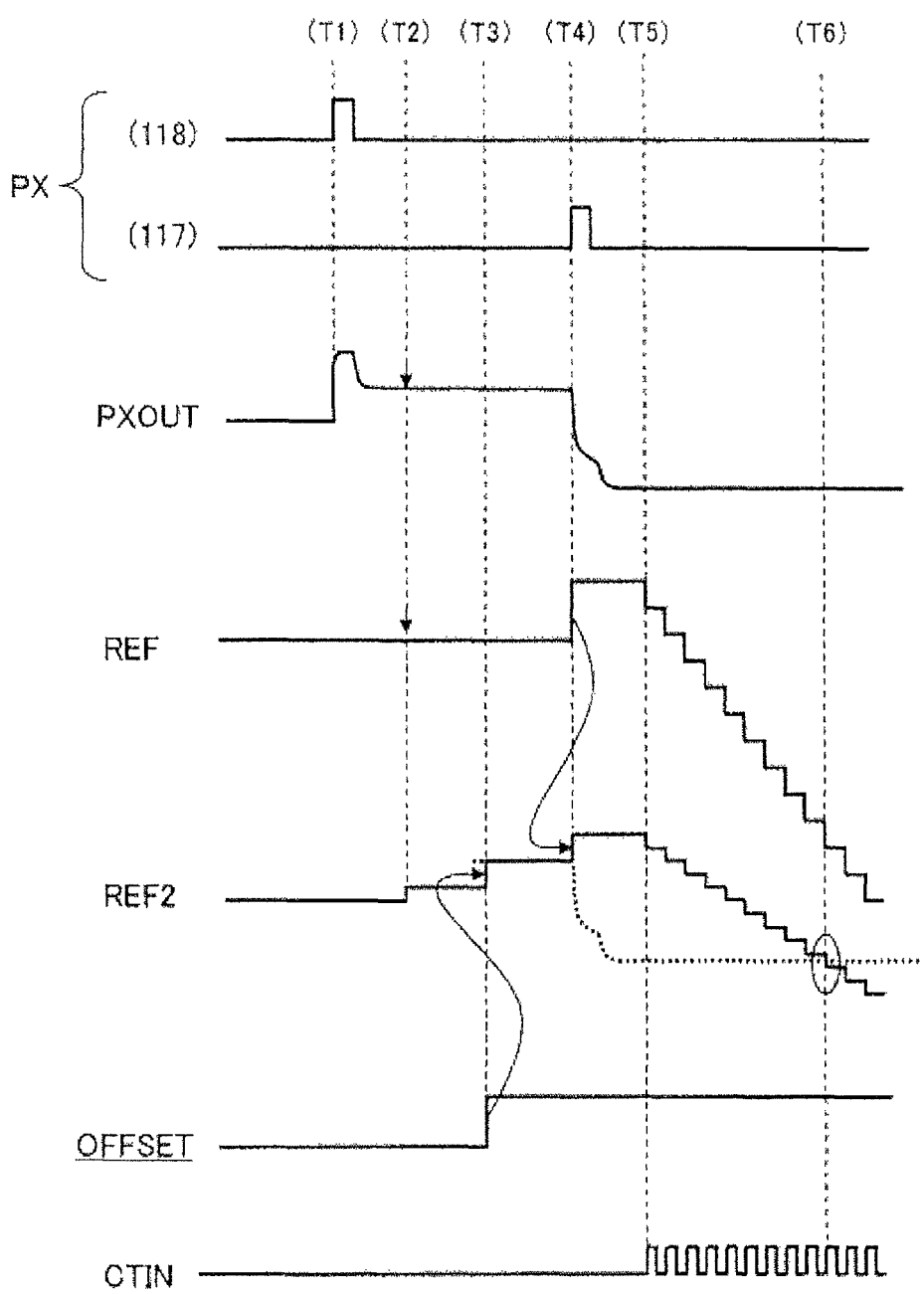
FIG. 7 is a diagram illustrating an example of operation waveforms of the AD conversion device in FIG. 6.

FIG. 7 is a diagram illustrating an example of operation waveforms of the AD conversion device in FIG. 6. A specific operation procedure of the AD conversion device in FIG. 6 will be described below referring to FIG. 7.

[Timing T1]

At a timing T1, a pulse is supplied to a gate of the reset transistor 113 in the pixel PX in FIG. 4, and a signal PXOUT at a reset level is output from the pixel PX.

[Timing T2]

At a timing T2, an input stage of the comparator 301 holds a charge for cancelling out the above-described reset signal to execute so-called CDS (correlated double sampling). For example, in a patent literature (Japanese Unexamined Patent Application Publication No. 2008-193373), in an "auto-zero" process, the input and an internal node of the comparator 301 are short-circuited, and a charge is distributed between input nodes 301_P and 301_R so as to allow both inputs to the comparator 301 to be balanced, and is then held in the input nodes 301_P and 301_R. It is to be noted that the intermediate node ND12 where a reference signal REF2 is developed may be preferably reset to a certain bias state during this operation, for example, by turning on the switch SW11.

[Timing T3]

At a timing T3, an offset bias OFFSET specific to each comparator 301 is applied to the offset terminal TOFFSET. The magnitude of the offset bias OFFSET is determined by calibration that will be described later, and is magnitude allowing the offset of the comparator 301 to be cancelled out. Ideally, at a point at which the cancellation of the offset is performed at the timing T2, the inputs of the comparator 301 are in a true balance state.

[Timing T4]

At a timing T4, a certain common offset is supplied to a terminal TREF in a negative signal direction to stabilize an output of the comparator 301 to one side. On the other hand, a pulse is supplied to a gate of the transfer transistor 112 in the pixel PX in FIG. 4, and the pixel signal PXOUT is output from the pixel PX.

[Timing T5]

At a timing T5, while a stepped pulse is supplied to the reference terminal TREF, a pulse in synchronization with the stepped pulse is supplied to the counter 302 so as to allow the counter 302 to advance.

[Timing T6]

At a timing T6, when the level of the reference signal REF2 in the node ND12 exceeds a balance state at the timing T3 relative to the pixel signal PXOUT, an output CMOUT of the comparator 301 is inverted. Accordingly, the counter 302 stops advancing, and the state is maintained. An output value of the counter 302 obtained in such a manner linearly reflects a difference between the pixel signal PXOUT (a second pixel signal PXOUT2) and the reset signal (a first pixel signal PXOUT1).

In this embodiment, variations in inverting timing by the offset for each comparator 301 is corrected by the offset bias ODDSET applied to the offset terminal TOFFSET at the timing T3.

Figure 8:
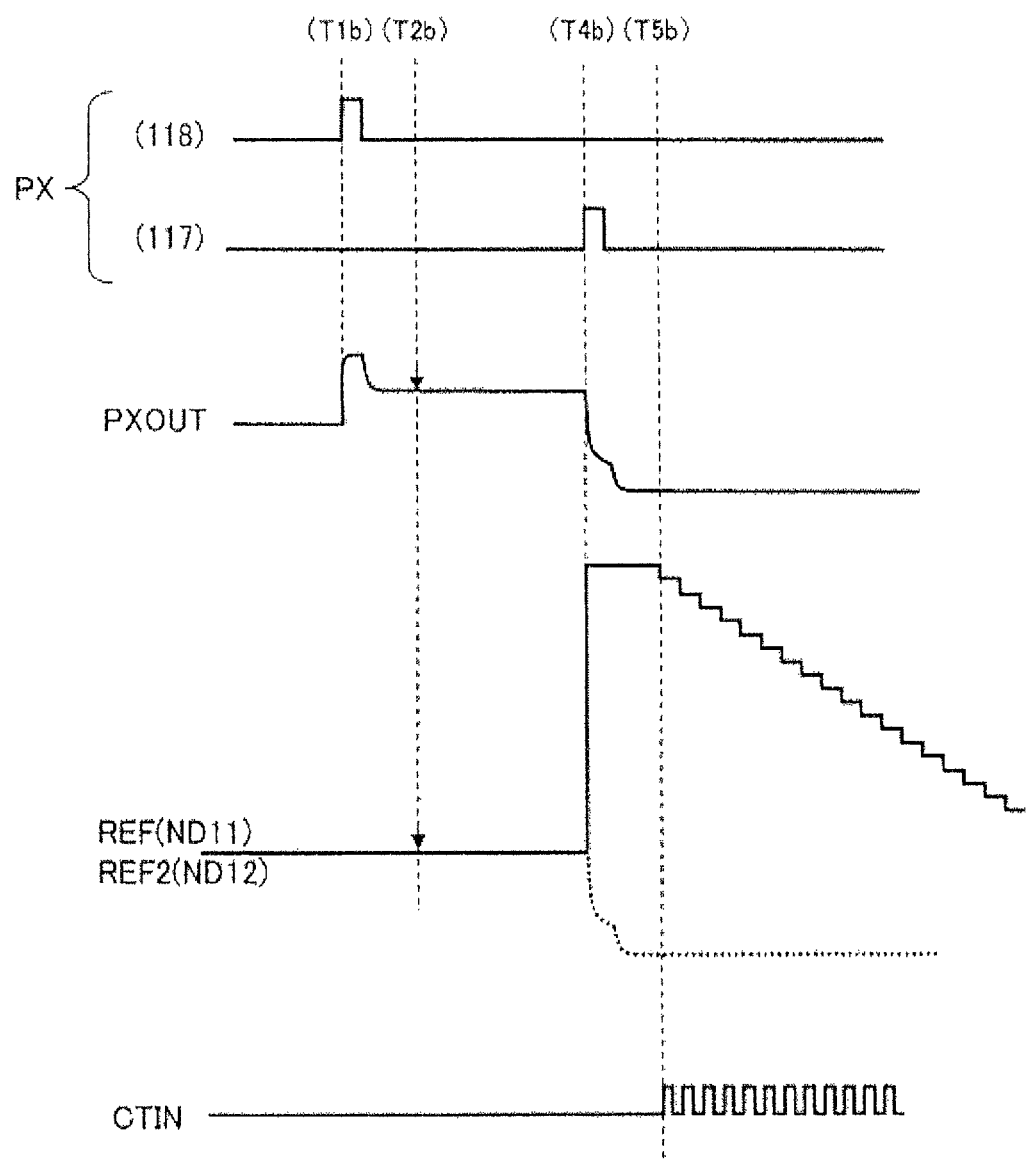
FIG. 8 is a diagram illustrating operation waveforms of an AD conversion device in a case where an offset bias application section is not provided.

FIG. 8 is a diagram illustrating operation waveforms of the AD conversion device in a case where an offset bias application section is not provided. To clearly specify effects of this embodiment in which the offset bias application section is provided, operation waveforms in a case where the node ND12 in which the AD conversion device operates by directly connecting the reference signal REF2 in FIG. 6 is developed to the terminal TREF without performing such correction by an offset bias are illustrated.

In a case where, unlike this embodiment, the above-described correction by the offset bias is not performed, at a timing T4b in FIG. 8, it is necessary to apply a large potential so as to allow a common offset supplied to the node ND12 (REF2) to cover this. For example, in a case where an offset of a few mV is expected in the comparator 301, unless a common offset sufficiently exceeding the offset is supplied, outputs of all comparator are not allowed to be stabilized to one side. Typically, for sweep of the reference signal REF, in addition to a range originally necessary for pixel signal detection, it is necessary to cover a range twice (corresponding to variations on a positive side and a negative side) as large as the above-described offset, and accordingly, excessive counts are necessary. For example, in a patent literature (Japanese Unexamined Patent Application Publication No. 2006-20173) or a patent literature (Japanese Unexamined Patent Application Publication No. 2008-193373), offset correction is performed by subtracting a count value obtained by calibration of a light-shielded pixel or a no-signal from excessive counts. However, in these cases, the above-described excessive counts are still necessary.

On the other hand, when the technology of this embodiment is adopted, the common offset at the timing T4 is allowed to be largely reduced by application of the offset bias at the timing T3, and a sweep range of the reference signal and a redundancy of the number of counts associated with the offset for each comparator 301 are not necessary. Therefore, specifically in a binary decision on one photon signal or detection of a low-illuminance signal, a reading process is largely shortened, and an increase in speed and an increase in frame rate are possible.

The above-described AD conversion device is an example of a simplest AD conversion device adopted in this embodiment.

Figure 9:
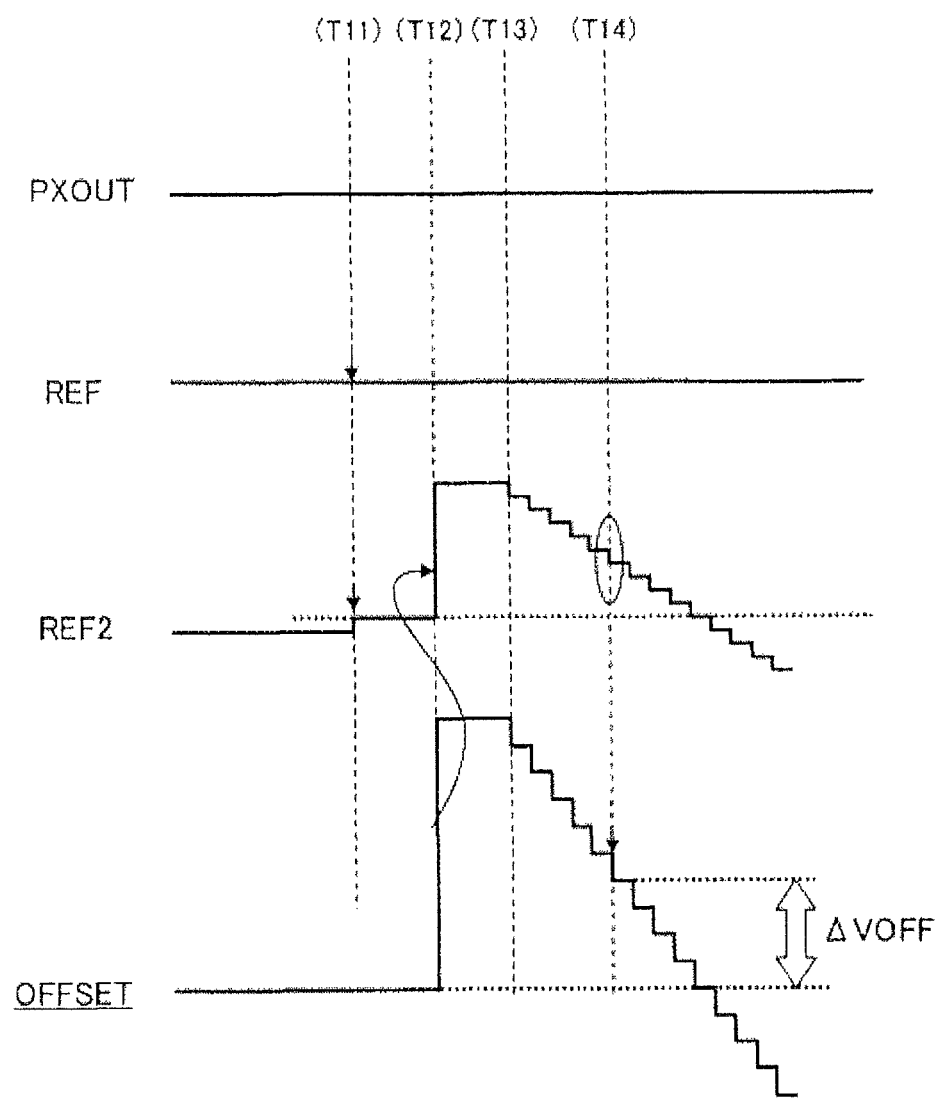
FIG. 9 is a diagram for describing an example of calibration of an offset bias according to the embodiment.

FIG. 9 is a diagram illustrating an example of calibration of an offset bias according to this embodiment. An example of calibration of an offset bias will be described below referring to FIG. 9. In this case, the pixel output PXOUT and the reference signal REF are fixed, and the offset bias OFFSET applied to the offset terminal TOFFSET with respect to the no-signal is changed in a plurality of steps to derive an offset bias at the time of inversion from an output state of the comparator 301.

[Timing T11]

At a timing T11, an input stage of the comparator 301 holds a charge for execution of so-called CDS in a manner similar to that at the time of reading of the pixel signal so as to balance an input side for the pixel signal PXOUT and an input side for the reference signal REF. The intermediate node ND12 (REF2) is reset to a certain bias state during this operation, for example, by turning on the switch SW11.

[Timing T12]

At a timing T12, a certain common offset is supplied to the offset terminal TOFFSET in a negative signal direction to stabilize the output of the comparator 301 to one side.

[Timing T13]

At a timing T13, a bias of the offset bias OFFSET is changed in a plurality of steps in a stepwise manner.

[Timing T14]

At a timing T14, a bias value $\Delta VOFF$ of the offset bias OFFSET when the output of the comparator 301 is inverted is considered as an offset bias for each comparator 301. The bias amount for each comparator 301 is stored, and in a process of reading the pixel signal, the bias amount is applied to the offset terminal TOFFSET.

It is to be noted that, in a case where the reference signal REF is swept at high speed in pixel reading, in addition to the above-described offset of the comparator 301, variations in a delay in inversion in each comparator 301 and a delay in transmission of the reference signal REF are added as other fixed noise. As measures against such noise, a coupling capacitance between the node ND12 (REF2) and the node ND11 (REF) and a coupling capacitance between the node ND12 (REF2) and the terminal TOFFSET in FIG. 6 are equalized. Then, a bias value of the offset bias OFFSET in the calibration in FIG. 9 is changed along a gradient same as that of stepped sweep of the reference signal REF in pixel reading in FIG. 7. Accordingly, the noise is allowed to be cancelled out together with cancellation of the offset of the comparator 301.

FIGS. 10(A) and (B) are diagrams illustrating configuration examples of offset bias generation circuits configured to generate an offset bias according to this embodiment. Next, the configuration examples of the offset bias generation circuits will be described below referring to FIGS. 10(A) and (B). In each of these circuits, a storage section configured to hold a bias amount determined by calibration is disposed.

An offset bias generation circuit 310A in FIG. 10(A) is configured of a source follower SF21, switches SW21 and SW22, a capacitor C21, and a power supply V21.

In this offset bias generation circuit 310A, a bias is supplied through the source follower SF21. In other words, a bias is generated by switching an output of the offset bias OFFSET from a fixed voltage supply terminal BSLEV connected to the power supply V21 as a reference level of the offset bias to an output of the source follower SF21. In calibration, an input of the source follower SF21 is connected to an offset bias supply terminal TOFFSET_SRC common to respective comparators with the switch SW21 in between, and a plurality of bias steps are supplied from OFFSET_SRC. When the output of the comparator 301 is inverted at the above-described timing T14 in FIG. 9, the switch SW21 is turned off, and a bias amount of the offset at this time is stored as a charge in the capacitor C21.

An offset bias generation circuit 310B in FIG. 10(B) is configured of fixed voltage supply lines OFFSET_[1] to [3], a fixed voltage supply terminal BSLEV, a switch group SWG including switches SW23 to SW26, and a selection circuit SEL21.

In this offset bias generation circuit 310B, a plurality of bias steps are supplied to the fixed voltage supply lines OFFSET_[1] to [3] common to respective comparators in advance. A bias is generated by selecting one switch from the switch group SWG to switch the output of the offset bias OFFSET from the fixed voltage supply terminal BSLEV as the reference level of the offset bias to one of OFFSET_[1] to [3]. In calibration, a plurality of bias steps are supplied by sequentially selecting the fixed voltage supply lines OFFSET_[1] to [3]. When the output of the comparator 301 is inverted at the above-described timing T14 in FIG. 9, a selection state at this time is stored in a register in the selection circuit SEL21, and a bias amount is thereby stored.

Moreover, with use of a selection circuit similar to the offset bias generation circuit 310B and switches, capacitors may be arranged side by side on output sides of the respective switches, and an offset bias may be generated with use of coupling by the capacitors.

Figure 1:
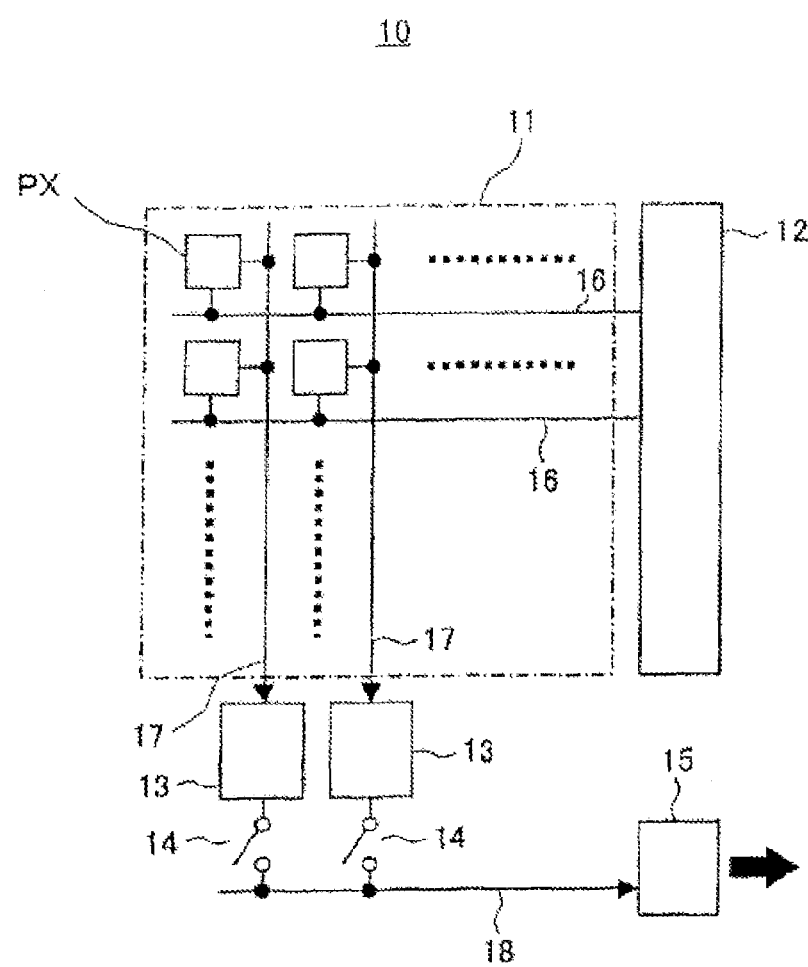
FIG. 1 is a diagram illustrating a typical chip configuration of a CMOS image sensor as a solid-state imaging device.
Figure 2:
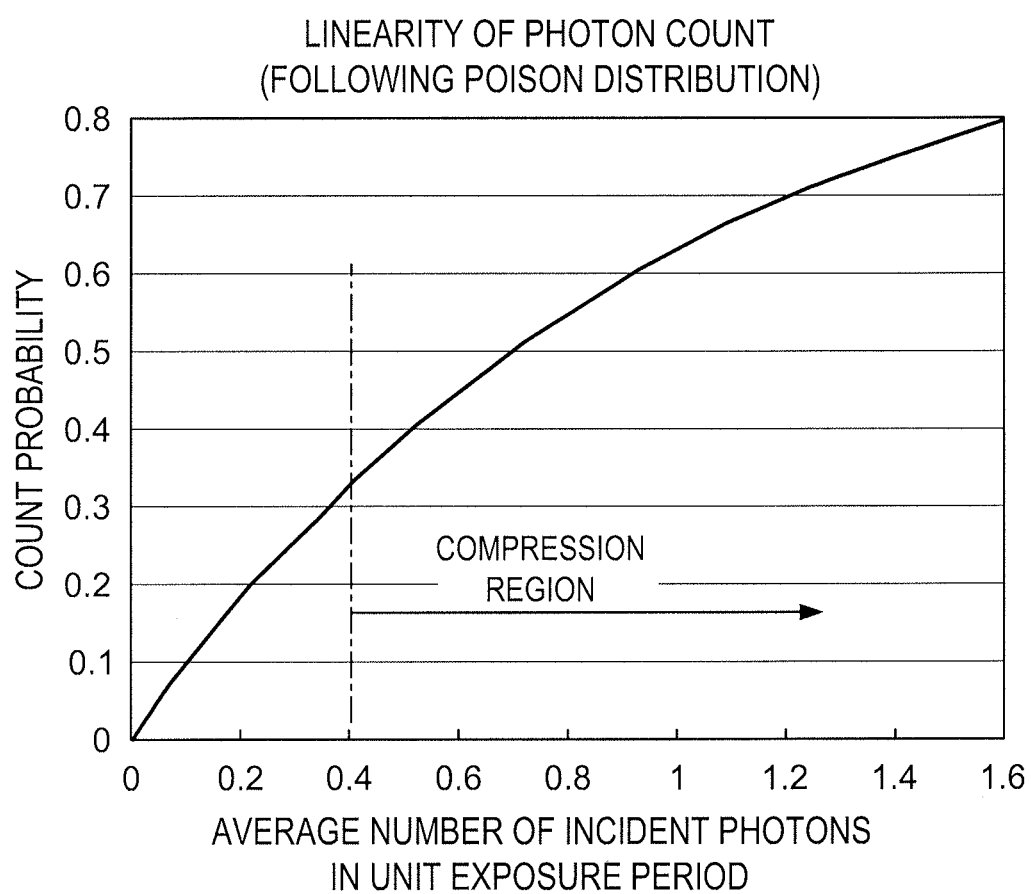
FIG. 2 is a diagram illustrating an example of the average number of incident photons in a unit exposure period and count probability (the average number of counts per unit exposure period).

Incidentally, in the AD conversion device, a noise component randomly generated in every reading is included, and is not allowed to be cancelled out only by application of the above-described offset bias. For example, in a process in which a charge is held in the input section of the comparator 301 for CDS at the timing T2 in FIG. 2, kTC noise associated with retention capacity is added in actuality, and the kTC noise causes generation of an extremely small random offset. Such a random offset is allowed to be completely cancelled out by additionally sweeping the reference potential for cancellation of a remaining offset after applying the above-described offset bias. Moreover, at this time, an error in determination of the offset amount generated by calibration is allowed to be corrected simultaneously.

Figure 11:
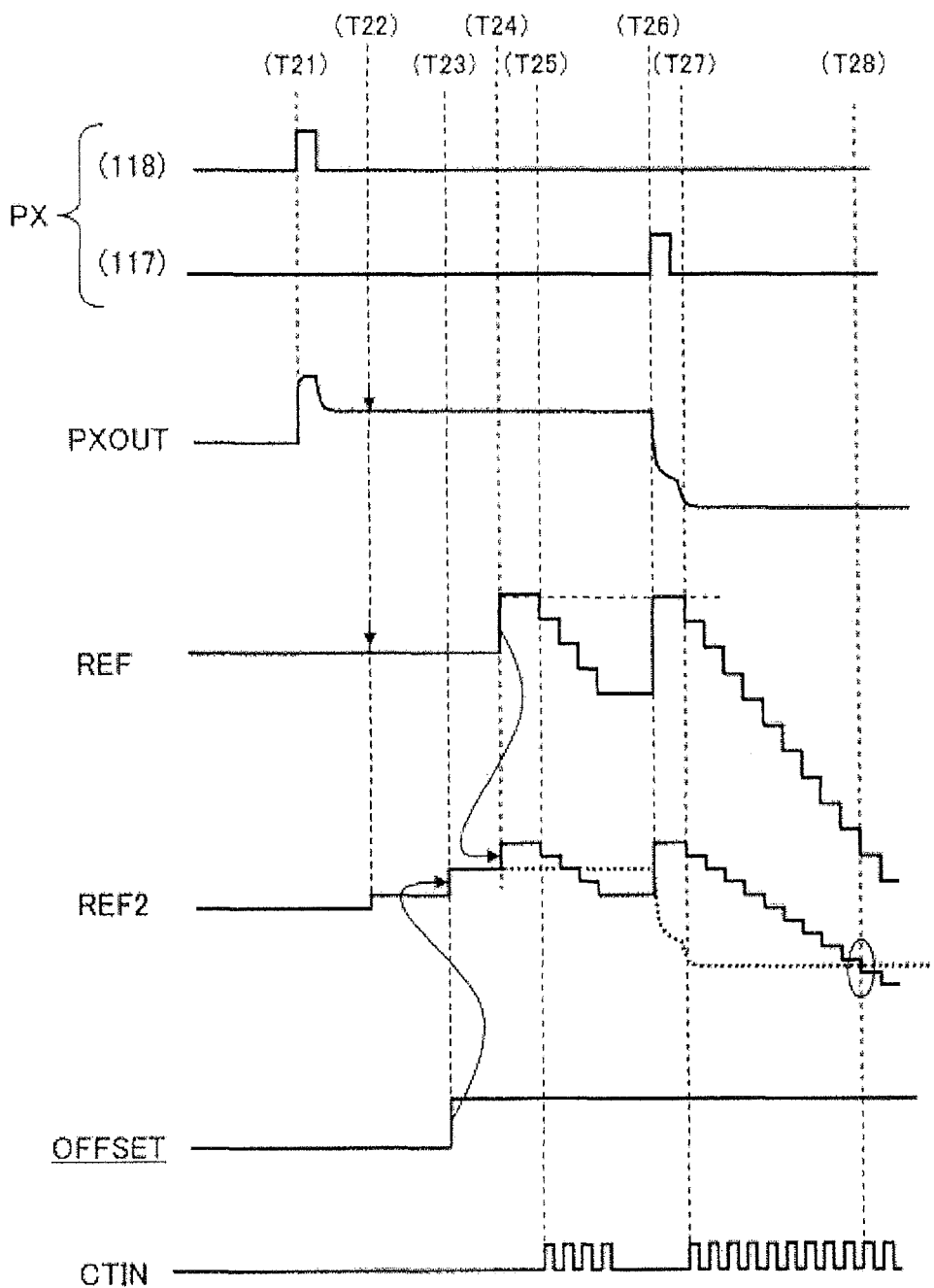
FIG. 11 is a diagram illustrating an example of operation waveforms in a case where error correction is performed from one row to another in the AD conversion device according to the embodiment.

FIG. 11 is a diagram illustrating an example of operation waveforms in a case where error correction is performed from one row to another in the AD conversion device according to this embodiment.

A circuit configuration of the AD conversion device is similar to that in FIG. 6. In this case, after the offset of the comparator 301 is corrected by application of the offset bias, an error component and a random noise component of the comparator or the like at this time are corrected and cancelled out by additionally sweeping the reference signal REF.

[Timing T21]

At a timing T21, a pulse is supplied to the gate of the reset transistor 113 in the pixel PX in FIG. 4, and the signal PXOUT at a reset level is output from the pixel PX.

[Timing T22]

At a timing T22, the input stage of the comparator 301 holds a charge for cancelling out the above-described reset signal to execute so-called CDS. It is to be noted that the intermediate node ND12 where the reference signal REF2 is developed may be preferably reset to a certain bias state during this operation, for example, by turning on the switch SW11.

[Timing T23]

At a timing T23, an offset bias OFFSET specific to each comparator 301 is applied to the offset terminal TOFFSET. The magnitude of the offset bias OFFSET is determined by calibration that will be described later, and is magnitude allowing the offset of the comparator 301 to be cancelled out. Ideally, at a point at which the cancellation of the offset is performed at the timing T22, the inputs of the comparator 301 are in a true balance state; however, an error in random noise generated on the comparator 301 side or calibration remains as an extremely small offset component.

[Timing T24]

At a timing T24, a certain common offset is supplied to the terminal TREF in a negative signal direction to stabilize the output of the comparator 301 to one side.

[Timing T25]

At a timing T25, while a first stepped pulse is supplied to the terminal TREF, a pulse in synchronization with the stepped pulse is supplied to the counter 302 so as to allow the counter 302 to count down. When the output of the comparator 301 is inverted, the counter 302 stops advancing accordingly, and the state is maintained.

[Timing T26]

At a timing T26, the terminal TREF is returned to a state at the timing T24. At this time, the output of the comparator 301 is also returned to the state at the timing T24. On the other hand, a pulse is supplied to the gate of the transfer transistor 112 in the pixel PX in FIG. 4, and the pixel signal PXOUT Is output from the pixel PX.

[Timing T27]

At a timing T27, while a second stepped pulse is supplied to the terminal TREF, a pulse in synchronization with the stepped pulse is supplied to the counter 302 so as to allow the counter 302 to count up.

[Timing T28]

At a timing T28, the output CMOUT Of the comparator 301 is inverted, and accordingly, the counter 302 stops advancing, and the state is maintained. The output value of the counter 302 obtained in such a manner linearly reflects a difference between the pixel signal PXOUT2 output from the pixel PX and the reset signal PXOUT1.

In this case, while an increase in sweep time associated with sweep for correction at the timing T25 is added, precision of signal detection is improved accordingly. Moreover, since correction by the offset bias is performed on each comparator 301 at the timing T23 in advance, only an extremely small common offset is necessary at the timing T24, compared to a case where the correction by the offset bias is not performed, and total necessary time is largely shortened.

Incidentally, a timing of execution of calibration of the offset bias has various choices such as when power is supplied and in every frame. Moreover, when the calibration is performed in large steps, it is effective to execute the calibration in every reading in combination with the above-described sweep of the reference signal for correction.

Figure 12:
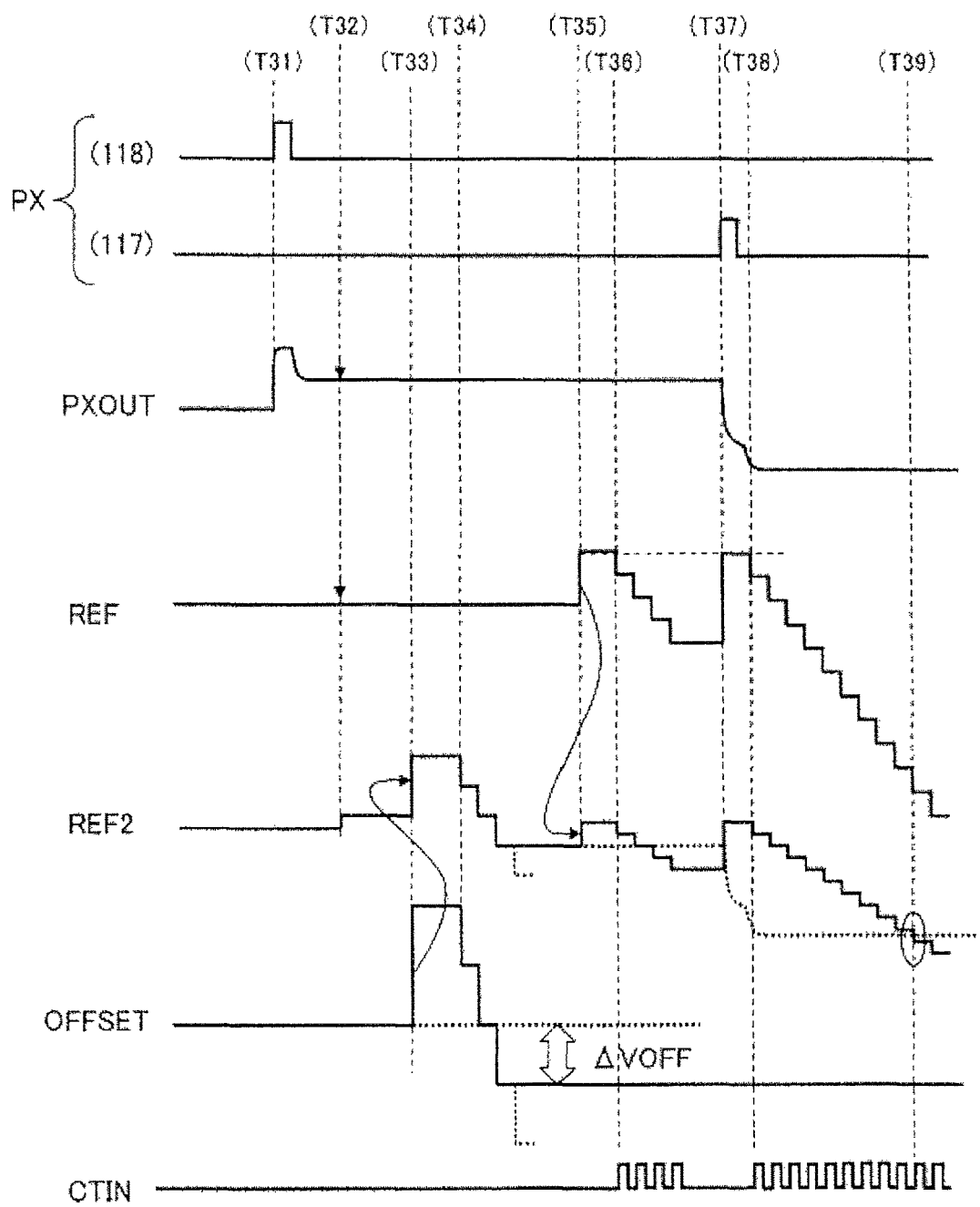
FIG. 12 is a diagram illustrating an example of operation waveforms in a case where offset calibration is performed from one row to another in the AD conversion device according to the embodiment.

FIG. 12 is a diagram illustrating an example of operation waveforms in a case where offset calibration is performed from one row to another in the AD conversion device according to this embodiment.

[Timing T31]

At a timing T31, a pulse is supplied to the gate of the reset transistor 113 in the pixel PX in FIG. 4, and the signal PXOUT at a reset level is output from the pixel PX.

[Timing T32]

At a timing T32, the input stage of the comparator 301 holds a charge for cancelling out the above-described reset signal to execute so-called CDS. It is to be noted that the intermediate node ND12 where the reference signal REF2 is developed may be preferably reset to a certain bias state during this operation, for example, by turning on the switch SW11.

[Timing T33]

At a timing T33, an offset bias $\Delta$VOFF specific to each comparator 301 is applied to the offset terminal TOFFSET through a calibration process at the timings T33 to T34. First, a certain common offset is applied to stabilize the output of the comparator 301 to one side.

[Timing T34]

At the timing T34, the bias of the offset bias OFFSET is changed in a plurality of steps in a stepwise manner. The bias value $\Delta$VOFF of the offset bias OFFSET when the output of the comparator 301 is inverted is considered as an offset bias for each comparator 301. This calibration process is basically equivalent to a calibration process in which the calibration in FIG. 9 is performed in every reading.

[Timing T35]

At a timing T35, a certain common offset is supplied to the terminal TREF in the negative signal direction, and the output of the comparator 301 is inverted again.

[Timing T36]

At a timing T36, while a first stepped pulse is supplied to the terminal TREF, a pulse in synchronization with the stepped pulse is supplied to the counter 302 so as to allow the counter 302 to count down. When the output of the comparator 301 is inverted, the counter 302 stops advancing accordingly, and the state is maintained.

[Timing T37]

At a timing T37, the terminal TREF is returned to a state at the timing T35. At this time, the output of the comparator 301 is also returned to the state at the timing T35. On the other hand, a pulse is supplied to the gate of the transfer transistor 112 in the pixel PX in FIG. 4, and the pixel signal PXOUT is output from the pixel PX.

[Timing T38]

At a timing T38, while a second stepped pulse is supplied to the terminal TREF, a pulse in synchronization with the stepped pulse is supplied to the counter 302 so as to allow the counter 302 to count up.

[Timing T39]

At a timing T39, the output CMOUT of the comparator 301 is inverted, and accordingly, the counter 302 stops advancing, and the state is maintained. The output value of the counter 302 obtained in such a manner linearly reflects a difference between the pixel signal PXOUT2 output from the pixel PX and the reset signal PXOUT1.

In this technique, in addition of cancellation of the offset of the comparator 301, for example, kTC noise and the like generated on the AD converter side when a charge at the timing T32 is held are nearly completely cancelled out in the end. A low-frequency component of random noise generated in the comparator and the like is also cancelled out, therefore, an influence of the random noise remains minimal. Moreover, at the timing T34, the offset of the comparator 301 is cancelled out in large steps in advance; therefore, only a correction portion of the offset at the timing T36 is swept, and the number of necessary steps is allowed to be largely reduced. For example, when calibration of the offset bias is performed in N steps (N>1), the number of necessary steps of the reference signal REF at T106 may be about 1/N of the typical number of necessary steps.

Figure 13:
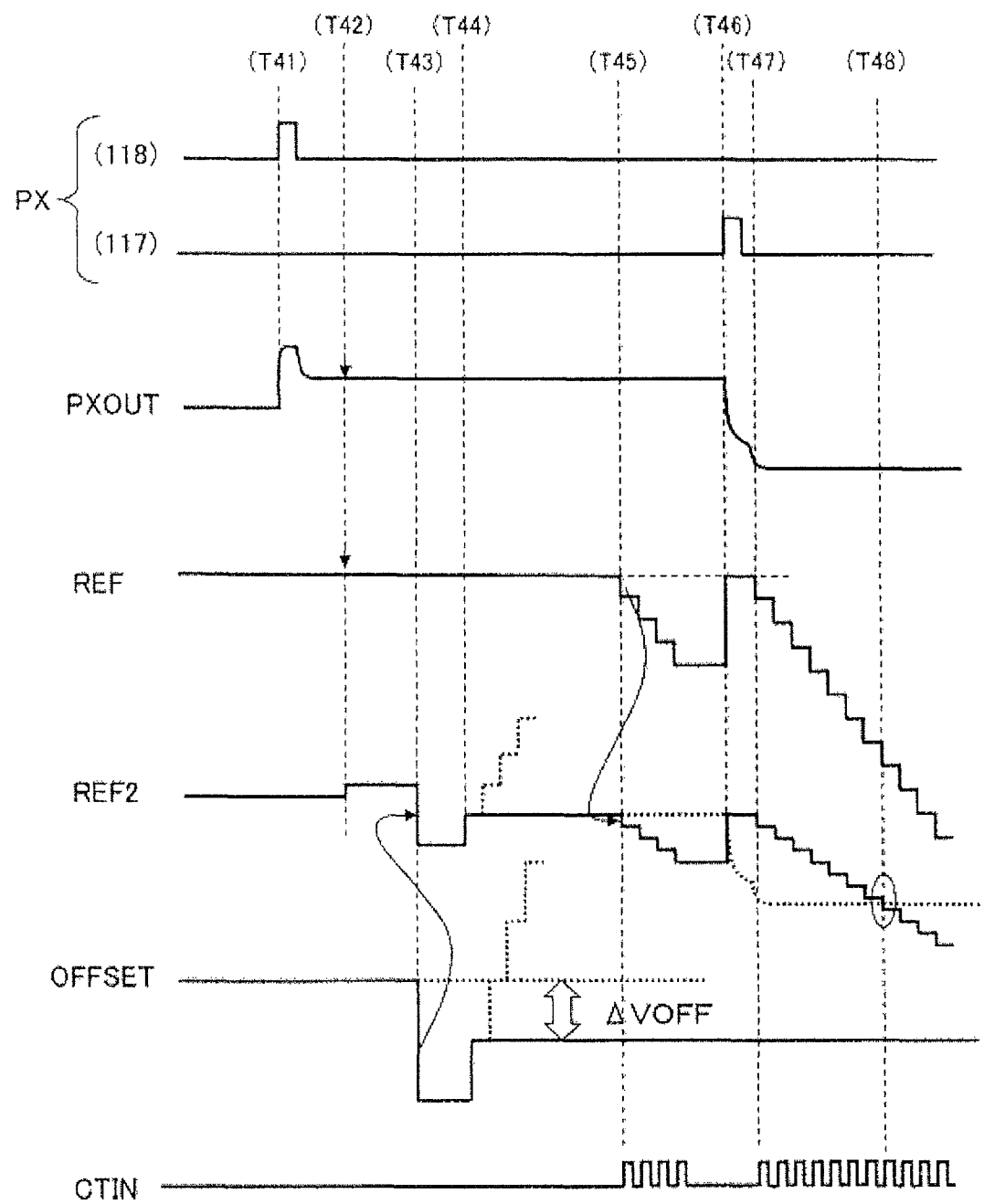
FIG. 13 is a diagram illustrating another example of the operation waveforms in the case where offset calibration is performed from one row to another in the AD conversion device according to the embodiment.

FIG. 13 is a diagram illustrating another example of the operation waveforms in a case where the offset calibration is performed from one row to another in the AD conversion device according to this embodiment. FIG. 13 illustrates an example in which the calibration of the offset bias is executed in a reverse bias direction. In a case where calibration is performed in every reading, a part of a procedure is thereby simplified.

[Timing T41]

At a timing T41, a pulse is supplied to the gate of the reset transistor 113 in the pixel PX in FIG. 4, and the signal PXOUT at a reset level is output from the pixel PX.

[Timing T42]

At a timing T42, the input stage of the comparator 301 holds a charge for cancelling out the above-described reset signal to execute so-called CDS. It is to be noted that the intermediate node ND12 where the reference signal REF2 is developed may be preferably reset to a certain bias state during this operation, for example, by turning on the switch SW11.

[Timing T43]

At a timing T43, the offset bias $\Delta$VOFF specific to each comparator 301 is applied to the offset terminal TOFFSET through a calibration process at the timings T43 to T44. First, a certain common offset is applied to stabilize the output of the comparator 301 to one side.

[Timing T44]

At the timing T44, the bias of the offset bias OFFSET is changed in a plurality of steps in a stepwise manner. The bias value $\Delta$VOFF of the offset bias OFFSET when the output of the comparator 301 is inverted is considered as an offset bias for each comparator 301. This calibration process is basically equivalent to the calibration process in which the calibration in FIG. 9 is performed in every reading. The calibration in this example is executed in a bias direction opposite to that in FIG. 12, and the output of the comparator 301 is set to a side suitable for sweep of a next reference signal REF; therefore, it is not necessary to invert the output of the comparator 301.

[Timing T45]

At a timing T45, while a first stepped pulse is supplied to the terminal TREF, a pulse in synchronization with the stepped pulse is supplied to the counter 302 so as to allow the counter 302 to count down. When the output CMOUT of the comparator 301 is inverted, the counter 302 stops advancing accordingly, and the state is maintained.

[Timing T46]

At a timing T46, the terminal TREF is returned to an initial state at the timing T45. At this time, the output CMOUT of the comparator 301 is also returned to an initial state at a timing T4. On the other hand, a pulse is supplied to the gate of the transfer transistor 112 in the pixel PX in FIG. 4, and the signal PXOUT is output from the pixel PX.

[Timing T47]

At a timing T47, while a second stepped pulse is supplied to the terminal TREF, a pulse in synchronization with the stepped pulse is supplied to the counter 302 so as to allow the counter 302 to count up.

[Timing T48]

At a timing T48, the output CMOUT of the comparator 301 is inverted, and accordingly, the counter 302 stops advancing, and the state is maintained. An output value of the counter 302 obtained in such a manner linearly reflects a difference between the pixel signal PXOUT2 output from the pixel PX and the reset signal PXOUT1.

In principle, each of the above-described techniques is described, based on the pixel PX in FIG. 4. The pixel PX is not limited to the configuration in FIG. 4, and, for example, a configuration illustrated in FIG. 14 may be adopted, and the present technology is applicable to these pixels.

Figure 14:
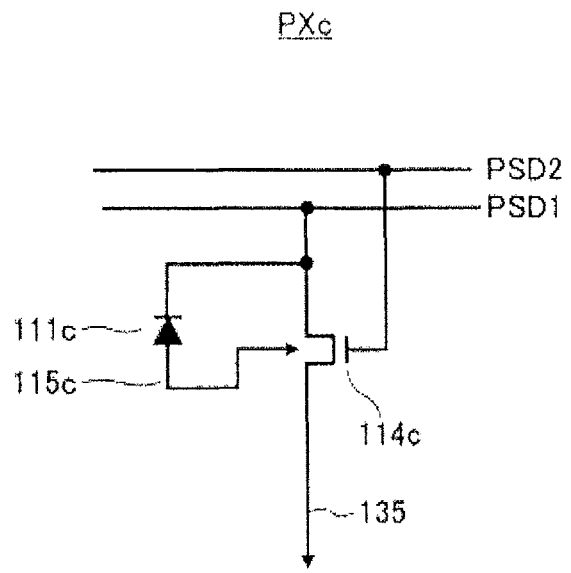
FIG. 14 is a diagram illustrating another example of the circuit configuration of the pixel according to the first embodiment.

FIG. 14 is a diagram illustrating another example of the circuit configuration of the pixel according to the first embodiment.

A pixel PXc in FIG. 14 is basically configured of a photodiode 111*c* and an amplifier transistor 114*c*. This pixel PX2 obtains an output signal by modulating a potential on a substrate side of the amplifier transistor 114 by an accumulated charge of the pixel. The pixel PXc accumulates, in a node 115*c*, a charge (in this case, holes are used) generated by photoelectric conversion of the photodiode 111*c*, and an output of the pixel PXc is modulated by modulating a substrate bias of the amplifier transistor 114*c*.

In such a pixel PXc, the accumulated charge consistently stays in a deep potential section in a bulk, and is not easily captured by a charge trap on a substrate surface; therefore, there is a possibility that the pixel PXc is advantageous in handling of an extremely small charge. Moreover, generation of kTC noise is preventable by completely depleting the node 115*c* to turn the node 115*c* to a reset state.

In the signal reading, first, a signal in an accumulation state is read, and then a high voltage is applied to a power supply drive line PSD1, PSD2, or the like to emit the charge of the node 115*c* from the substrate side, thereby turning the pixel to the reset state. After that, the signal is read again, and an offset component by variations in threshold value of the amplifier transistor 114 or the like is cancelled out by obtaining a difference between the signal in this reading and the signal in the previous reading to derive a net accumulation signal in the pixel. In other words, the order of reading of the accumulation signal and the reset signal is opposite to typical order.

Also in such a pixel, for example, while the present technology is applied, signal detection is allowed to be performed with use of the AD conversion device with a circuit configuration similar to that in FIG. 6. In this case, first, the accumulation signal is output from the pixel, and then the reset signal is output after DCS is executed.

Figure 15:
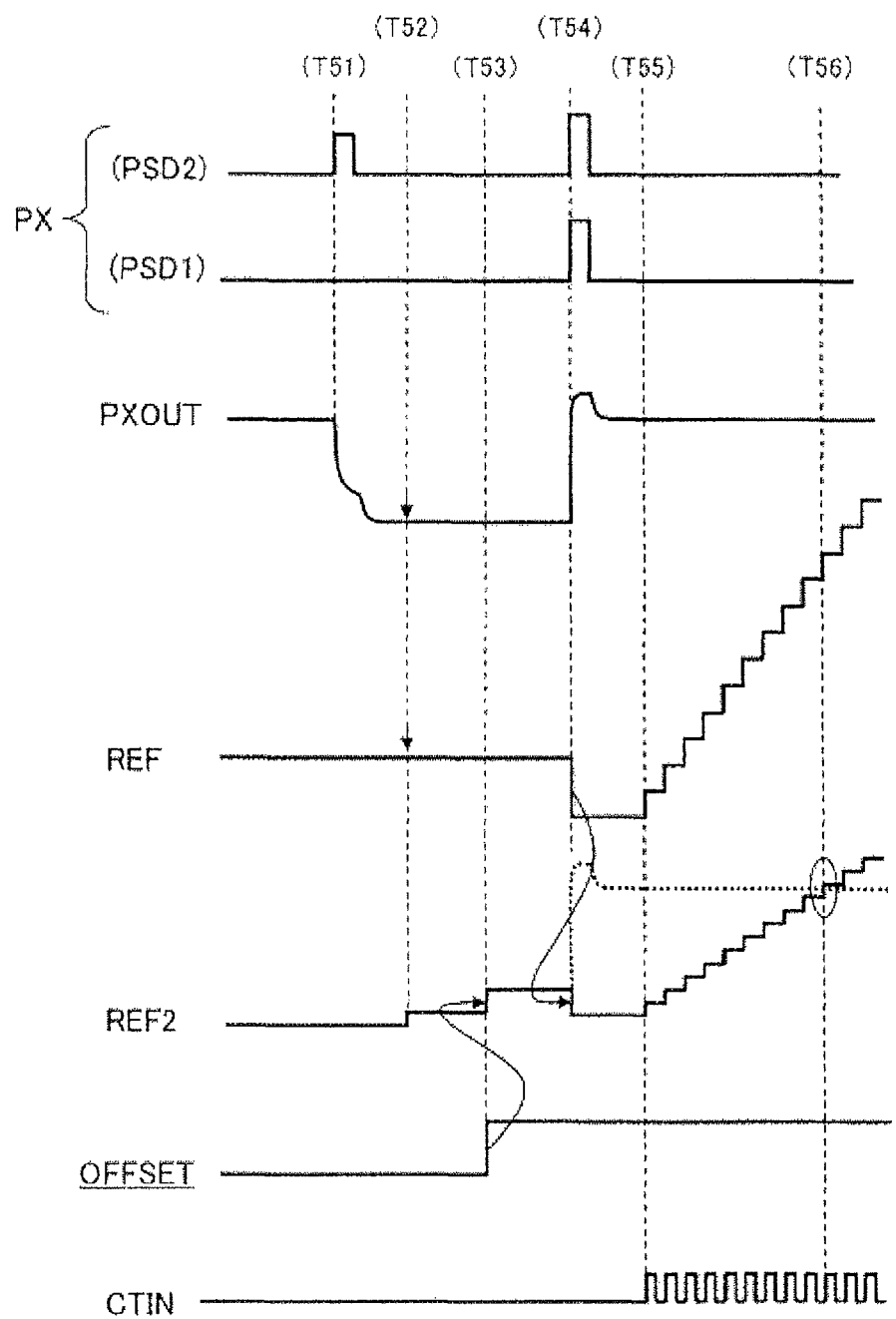
FIG. 15 is a diagram illustrating operation waveforms corresponding to the example in FIG. 7 in a case where the pixel in FIG. 14 is applied.

FIG. 15 is a diagram illustrating operation waveforms corresponding to the example in FIG. 7 in a case where the pixel in FIG. 14 is applied. An operation procedure in this case is as follows.

[Timing T51]

At a timing T51, a pulse is supplied to a gate of the amplifier transistor 114*c* in the pixel PXc in FIG. 14, and an accumulation signal PXOUT is output from the pixel PXc.

[Timing T52]

At a timing T52, the input stage of the comparator 301 holds a charge for cancelling out the above-described accumulation signal to execute so-called CDS.

[Timing T53]

At a timing T53, the offset bias OFFSET specific to each comparator 301 is applied to the offset terminal TOFFSET. The magnitude of the offset bias OFFSET is determined by calibration, and is magnitude allowing the offset of the comparator 301 to be cancelled out. Ideally, at a point at which the cancellation of the offset is performed at the timing T52, the inputs of the comparator 3010 are in a true balance state.

[Timing T54]

At a timing T54, a certain common offset is supplied to the terminal TREF to stabilize the output of the comparator 301 to one side. On the other hand, a high-voltage pulse is supplied from the power supply drive lines PSD1 and PSD2 to a gate and a drain of the amplifier transistor 114*c* in the pixel PXc in FIG. 14. Accordingly, holes accumulated in the node 115*c* on the substrate side are emitted, and a reset signal PXOUT1 is output from the pixel PXc.

[Timing T55]

At a timing T55, while a stepped pulse is supplied to the terminal TREF, a pulse in synchronization with the stepped pulse is supplied to the counter 302 so as to allow the counter 302 to advance.

[Timing T56]

At a timing T56, when the level of the reference signal REF2 in the intermediate node ND12 exceeds a balance state at the timing T53 relative to the pixel signal PXOUT, the output CMOUT of the comparator 301 is inverted. Accordingly, the counter 302 stops advancing, and the state is maintained. The output value of the counter 302 obtained in such a manner linearly reflects a difference between the reset signal PXOUT1 output from the pixel PXc and the pixel signal PXOUT2.

In other words, in the pixel as illustrated in FIG. 14, polarity of a substantial analog signal input in AD conversion at the timings T55 to T56 is only opposite; therefore, the present technology is capable of easily coping with the pixel by modification such as inverting polarity of an applied pulse of the reference signal REF in AD conversion.

Next, a configuration in which the AC conversion device of the sense circuit 121 is shared by a plurality of pixels PX will be described below as a second embodiment.

3. Second Embodiment

Figure 16:
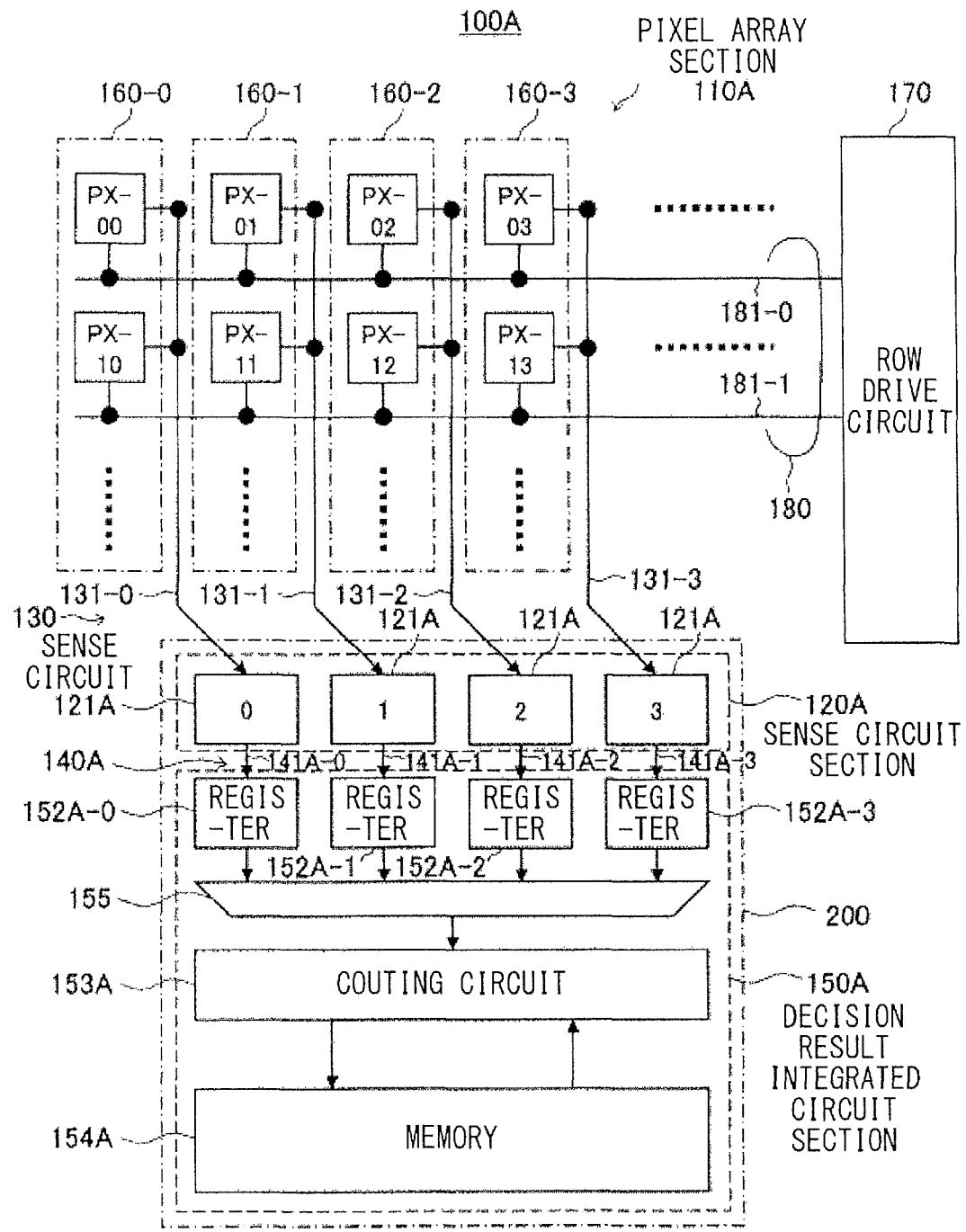
FIG. 16 is a diagram illustrating a configuration example of a CMOS image sensor (image pickup device) according to a second embodiment.

FIG. 16 is a diagram illustrating a configuration example of a CMOS image sensor (image pickup device) according to the second embodiment.

In the CMOS image sensor 100 according to the first embodiment, the pixels PX and the sense circuits 121 correspond to each other on a one-to-one basis. However, an area occupied by the pixels PX and an area occupied by the sense circuits 121 are not necessarily equal to each other. Moreover, in lamination of two substrates, a counting circuit or a memory with a large circuit scale may be disposed outside a pixel array region; therefore, while long-distance transfer of data from each sense circuit 121 at high speed is necessary, lamination of two substrates is likely to be restricted in layout. A CMOS image sensor 100A according to the second embodiment provides a flexible solution to the above-described issue by sharing one sense circuit (AD conversion device) by a plurality of pixels. Then, in the CMOS image sensor 100A according to this embodiment, an amplifier (column amplifier 304) of the AD conversion device is shared by a plurality of pixels.

In the CMOS image sensor 100A, a pixel array section 110A includes a plurality of pixels PX arranged along a row direction and a column direction in a matrix form. Then, each of pixel blocks 160-0 to 160-3, . . . is configured of a plurality of pixels PX in a same column and a selection circuit.

The CMOS image sensor 100A includes a row drive circuit 170 configured to drive the pixels PX of the pixel array section 110A to output electrical signals of the pixels PX to the output signal line 131, and a row control line group 180.

The CMOS image sensor 100A includes a circuit block 200 configured to perform binary decisions on the electrical signals transmitted through the output signal line 131, and to integrate decision results from each pixel a plurality of times to generate two-dimensional image pickup data with a gray scale. In the circuit block 200, a sense circuit section 120A and a decision result integrated circuit section 150A are disposed.

In the sense circuit section 120A, sense circuits 121-0, 121-1, 121-2, 121-3, . . . are disposed corresponding to the pixel blocks 160-0 to 160-3, . . . of the pixel array section 110A, respectively.

An input of the sense circuit 121-0 is connected to an output signal line 131-0 to which outputs of all of the pixels PX-00, and PX-10 to (PX-150) forming the pixel block 160-0 are connected. In other words, one sense circuit 121-0 is shared by a plurality of pixels PX-00 to (PX-150).

An input of the sense circuit 121-1 is connected to an output signal line 131-1 to which outputs of all of the pixels PX-01, and PX-11 to (PX-151) forming the pixel block 160-1 are connected. In other words, one sense circuit 121-1 is shared by a plurality of pixels PX-01 to (PX-151).

An input of the sense circuit 121-2 is connected to an output signal line 131-2 to which outputs of all of the pixels PX-02, and PX-12 to (PX-152) forming the pixel block 160-2 are connected. In other words, one sense circuit 121-2 is shared by a plurality of pixels PX-02 to (PX-152).

An input of the sense circuit 121-3 is connected to an output signal line 131-3 to which outputs of all of the pixels PX-03, and PX-13 to (PX-153) forming the pixel block 160-3 are connected. In other words, one sense circuit 121-3 is shared by a plurality of pixels PX-03 to (PX-153).

In the sense circuit section 120A, a sense circuit is arranged so as to be shared by a plurality of pixels of each of other pixel blocks that are not illustrated.

The decision result integrated circuit section 150A has a function of integrating decision results from each pixel by the sense circuits 121-1 to 121-3 a plurality of times to generate two-dimensional image pickup data with a gray scale. The decision result integrated circuit section 150A includes registers 152A-0 to 152A-3, a selection circuit 155, a counting circuit 153A, and a memory 154A.

The registers 152A-0 to 152A-3 hold decision values of the corresponding sense circuits 121-0 to 121-3 transferred through the transfer lines 141A-0 to 141A-3, respectively.

The selection circuit 155 sequentially selects outputs of the registers 152A-0 to 152A-3, and supplies the decision values held by the registers 152A-0 to 152A-3 to the counting circuit 153A.

The counting circuit 153A sequentially performs a counting process on decision values of a plurality of pixels (in this example, four pixels) in a row selected to be read through the selection circuit 155, and stores a counting result for each of the pixels in the memory 154A.

Data of the pixels at the time of previous reading is loaded from the memory 154A to the counting circuit 153A.

The decision result integrated circuit section 150A according to the second embodiment includes one counting circuit 153A, and the counting circuit 153A is shared by a plurality of registers 152A-0 to 152A-3. In other words, in the CMOS image sensor 100A according to the second embodiment, the counting circuit 153A is shared by a plurality of sense circuits 121A-0 to 121A-3.

Figure 17:
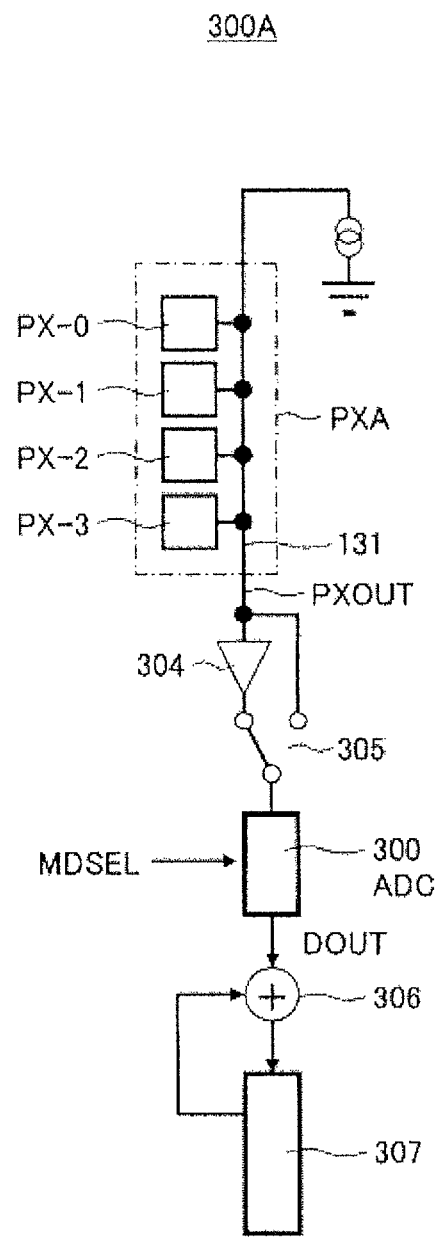
FIG. 17 is a diagram illustrating a configuration example of an AD conversion device in a sense circuit according to the second embodiment.
Figure 18:
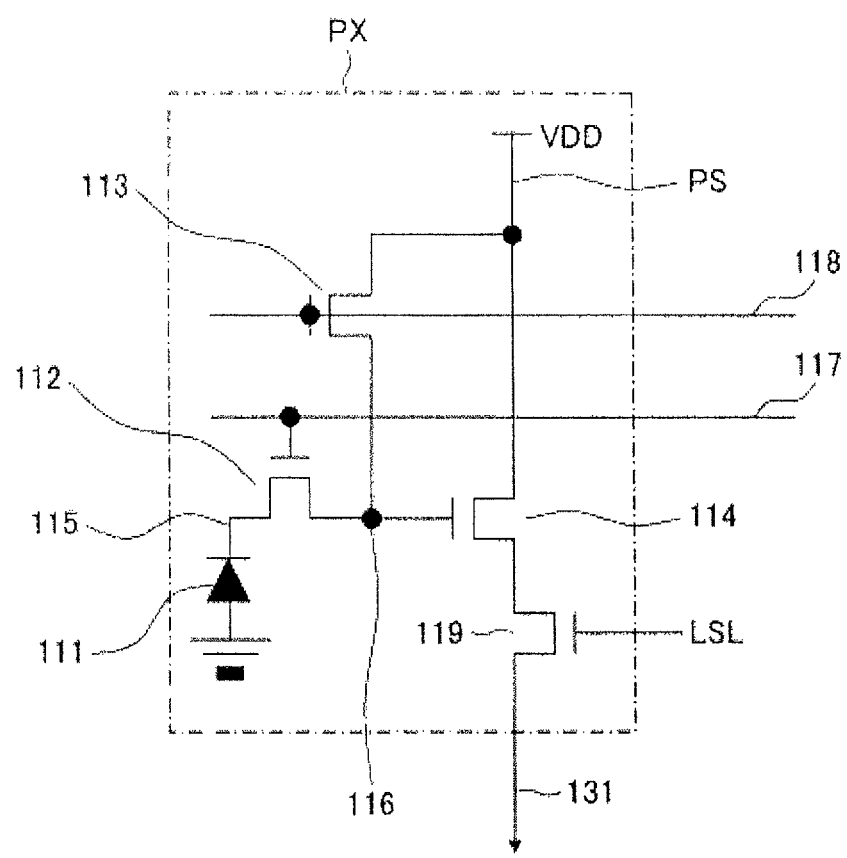
FIG. 18 is a diagram illustrating an example of a circuit configuration of a pixel according to the second embodiment.

FIG. 17 is a diagram illustrating a configuration example of the AD conversion device in the sense circuit according to the second embodiment. FIG. 18 is a diagram illustrating an example of a circuit configuration of a pixel according to the second embodiment.

Figure 19:
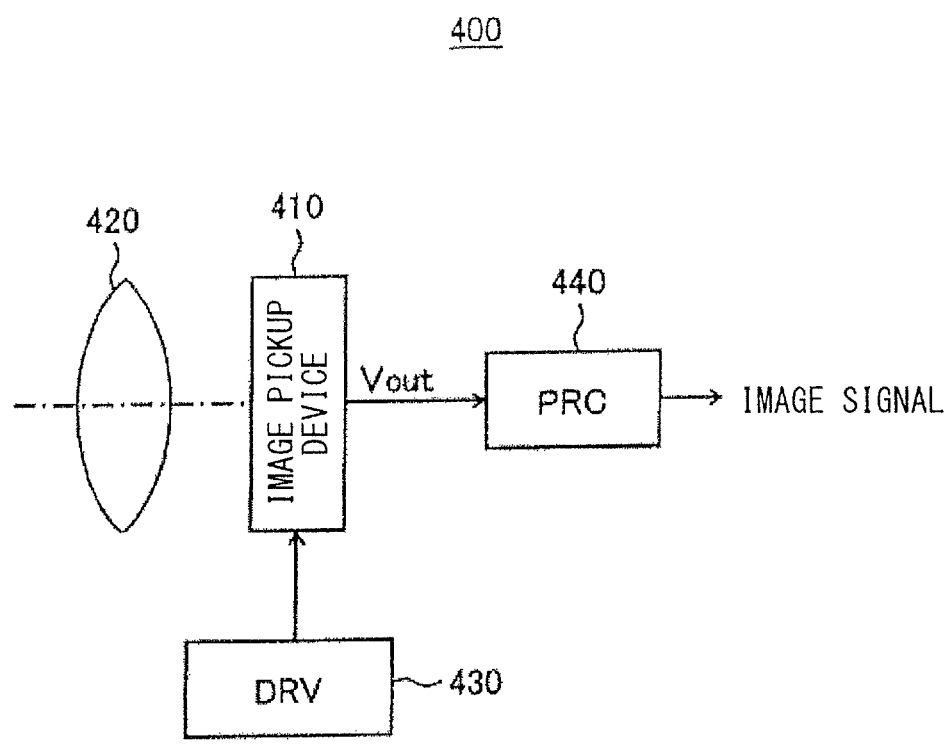
FIG. 19 is a diagram illustrating an example of a configuration of a camera system to which any of the solid-state image pickup devices according to the embodiments is applied.

The AD conversion device 300A in FIG. 17 is a configuration example in which the AD conversion device is connected to a plurality of pixels. In this case, in a pixel array PXA (the pixel block 160 in FIG. 16), for example, as illustrated in FIG. 19, pixels PX-0 to PX-3 with high conversion efficiency are connected to a same output signal line 131 with the selection transistor 119 in between. A gate of the selection transistor 119 is connected to a selection control line LSL.

In FIG. 17, the AD conversion device 300A may include, for example, a column amplifier 304, a switch 305, and further an adder 306 and a memory 307, in addition to the AD conversion device (ADC) 300.

The ADC 300 may be, for example, the AD conversion device illustrated in FIG. 6, and produces a binary output or a multi-bit gray-scale output from a low-illuminance signal.

The column amplifier 304 has an amplification function with a gain G>1. The column amplifier 304 relatively reduces an offset on the AD converter side or random noise by amplifying the pixel signal. An offset that the column amplifier has is cancelled out by CDS in a following stage. Thus, in the second embodiment, the ADC 300 and the column amplifier 304 are shared by a plurality of pixels.

The memory 307 holds light intensity of each pixel in a digital form. An output signal from a selected pixel is AD-converted into a one-bit or a multi-bit gray scale, and is output as an output signal DOUT. Data corresponding to the selected pixel is read from the memory 307, and an output of the output signal DOUT of the ADC 300 is added to the data by the adder 306, and a result from the adder 306 is stored in the memory 307 again.

Moreover, the adder 306 may be shared by a plurality of ADCs. A plurality of modes are considered as a chip configuration of the image pickup unit, and the adder 306 and the memory 307 may be mounted in an image pickup chip, or an image pickup chip may output a signal corresponding to the output signal DOUT, and the adder 311 and the memory 312 may be mounted in a signal processing chip following the image pickup chip.

It is to be noted that the present technology is made to reduce detection time causing noise that is present in the AD conversion device; therefore, the less the net number of steps necessary for signal detection is, the higher effect is allowed to be obtained. A highest effect is obtained in a case of a binary decision or detection of one photon. Moreover, a high effect is obtained in a case where application of the present technology is limited to image pickup at low illuminance.

As described above, in this embodiment, to reduce or eliminate sweep time for the offset of the comparator by the reference signal REF, a bias for offset cancellation specific to each comparator is applied to an input on one side of each comparator 301. In other words, in this embodiment, in a process of reading the pixel signal, first, a charge corresponding to the reset signal is held for CDS, and then an offset bias specific to each comparator is applied, and after that, reading of the pixel signal is performed to execute signal detection. Moreover, in this embodiment, after the offset bias is applied, first sweep of the reference signal REF is performed to accurately derive an offset, and second sweep is further performed after reading of the pixel signal, and a difference therebetween is detected as the pixel signal. Therefore, in this embodiment, an extremely small signal from the pixel or one photon signal is allowed to be detected with low noise and high precision at high speed, and various kinds of high-performance shooting are possible by increasing a frame rate with use of this.

Each of the image pickup devices according to the above-described embodiments is applicable as an image pickup device of a digital camera and a video camera.

3. Camera System

FIG. 19 is a diagram illustrating an example of a configuration of a camera system to which any of the solid-state image pickup devices according to the embodiments is applied.

As illustrated in FIG. 19, this camera system 400 includes an image pickup device 410 to which any of the CMOS image sensors (the solid-state image pickup devices) 100 and 100A according to the embodiments is applicable. The camera system 400 includes an optical system configured to guide incident light to a pixel region of the image pickup device 410 (configured to form an image of a subject), for example, a lens 420 configured to form an image of the incident light (image light) on an image pickup plane. The camera system 400 further includes a drive circuit (DRV) 430 configured to drive the image pickup device 410 and a signal processing circuit (PRC) 440 configured to process an output signal of the image pickup device 410.

The drive circuit 430 includes a timing generator (not illustrated) configured to generate various timing signals including a start pulse and a clock pulse for driving of a circuit in the image pickup device 410, and drives the image pickup device 410 by a predetermined timing signal.

Moreover, the signal processing circuit 440 applies predetermined signal processing on the output signal of the image pickup device 410. An image signal processed by the signal processing circuit 440 is recorded on a recording medium such as a memory. A hard copy of image information recorded on the recording medium is produced by a printer or the like. Further, the image signal processed by the signal processing circuit 440 is displayed as a moving image on a monitor configured of a liquid crystal display or the like.

As described above, in an image pickup unit such as a digital still camera, a camera with low power consumption and high precision is achievable by including the above-described image pickup device 100 or 100A as the image pickup device 410.

It is to be noted the present technology may have the following configurations.

(1) An image pickup device including:

a pixel array section including a plurality of pixels arranged in an array, each of the pixels including a photoelectric conversion device, a storage section configured to accumulate a charge generated by photoelectric conversion, and an amplifier device configured to output the accumulated charge as an electrical signal, each of the pixels configured to output an electrical signal to an output signal line in response to photon incidence;

a sense circuit section including sense circuits, each of the sense circuits configured to perform a process of detecting a pixel signal from the pixel; and a drive section configured to perform reading of a first pixel signal and reading of a second pixel signal from a selected pixel in reading, in which the first pixel signal and the second pixel signal are one and the other of a reset signal of a pixel corresponding to a no-signal accumulation state and an accumulation signal reflecting an accumulated charge generated by photoelectric conversion, in the sense circuit section, each of the sense circuits includes a comparator configured to compare an output signal from the pixel with a reference signal, and when signal detection is performed, a charge allowing the first pixel signal output from the selected pixel to be cancelled out is held in one or both of input sections of the comparator, an independent offset bias for each comparator is applied to one of the input sections of the comparator to cancel out an offset of the comparator, and a digital decision on intensity of light incident on the pixel is performed by comparing a reference signal changing in steps with the second pixel signal output from the selected pixel.

(2) The image pickup device according to (1), in which the offset bias is determined for each comparator by calibration, in the calibration, a predetermined signal is supplied to each of an input section for the pixel signal and an input section for the reference signal, a charge allowing a difference between the signals to be cancelled out is held in one or both of input sections of the comparator, and both of input signals are compared with each other while applying an offset bias in a plurality of steps to one of the input sections of the comparator to determine an offset bias for each comparator.

(3) The image pickup device according to (1) or (2), in which the sense circuit section measures an inverting timing for the comparator by sweeping a reference potential in steps after application of the offset bias, and in the digital decision, the reference potential is swept in the same steps to measure an inverting timing for the comparator, and light intensity is derived from a difference between the inverting timings.

(4) The image pickup device according to any one of (1) to (3), in which the digital decision is a binary decision as to whether or not a photon is incident.

(5) The image pickup device according to any one of (1) to (4), including a decision result integrated circuit section configured to integrate decision results from each pixel or each pixel group by the sense circuit a plurality of times to generate image pickup data with a gray scale.

(6) A camera system provided with an image pickup device, an optical system, and a signal processing circuit, the optical system configured to form an image of a subject on the image pickup device, the signal processing circuit configured to process an output image signal of the image pickup device, the image pickup device including:

a pixel array section including a plurality of pixels arranged in an array, each of the pixels including a photoelectric conversion device, a storage section configured to accumulate a charge generated by photoelectric conversion, and an amplifier device configured to output the accumulated charge as an electrical signal, each of the pixels configured to output an electrical signal to an output signal line in response to photon incidence;

a sense circuit section including sense circuits, each of the sense circuits configured to perform a process of detecting a pixel signal from the pixel; and a drive section configured to perform reading of a first pixel signal and reading of a second pixel signal from a selected pixel in reading, in which the first pixel signal and the second pixel signal are one and the other of a reset signal of a pixel corresponding to a no-signal accumulation state and an accumulation signal reflecting an accumulated charge generated by photoelectric conversion, in the sense circuit section, each of the sense circuits includes a comparator configured to compare an output signal from the pixel with a reference signal, and when signal detection is performed, a charge allowing the first pixel signal output from the selected pixel to be cancelled out is held in one or both of input sections of the comparator, an independent offset bias for each comparator is applied to one of the input sections of the comparator to cancel out an offset of the comparator, and a digital decision on intensity of light incident on the pixel is performed by comparing a reference signal changing in steps with the second pixel signal output from the selected pixel.

(7) The camera system according to (6), in which the offset bias is determined for each comparator by calibration, in the calibration, a predetermined signal is supplied to each of an input section for the pixel signal and an input section for the reference signal, a charge allowing a difference between the signals to be cancelled out is held in one or both of input sections of the comparator, and both of input signals are compared with each other while applying an offset bias in a plurality of steps to one of the input sections of the comparator to determine an offset bias for each comparator.

(8) The camera system according to (6) or (7), in which the sense circuit section measures an inverting timing for the comparator by sweeping a reference potential in steps after application of the offset bias, and in the digital decision, the reference potential is swept in the same steps to measure an inverting timing for the comparator, and light intensity is derived from a difference between the inverting timings.

(9) The camera system according to any one of (6) to (8), in which the digital decision is a binary decision as to whether or not a photon is incident.

(10) The camera system according to any one of (6) to (9), including a decision result integrated circuit section configured to integrate decision results from each pixel or each pixel group by the sense circuit a plurality of times to generate image pickup data with a gray scale.

REFERENCE SIGNS LIST 100, 100A CMOS image sensor
110 pixel array section
PX, PXA pixel
111 photodiode
112 transfer transistor
113 reset transistor
114 amplifier transistor
115 storage node
116 FD node
120 sense circuit section
121 sense circuit
130 output signal line group
131 output signal line
140 transfer line group
141 transfer line
150, 150A decision result integrated circuit section
152, 152A register
153, 153A counting circuit
154, 154A memory
155 selection circuit
160, 160C pixel block
170 row drive circuit
180 row control line group
181 row control line
200 circuit block
210 control circuit
220 demultiplexer
230 register group
231 register
300, 300A AD conversion device
301 comparator
302 counter
303 output mode selection section
304 column amplifier
305 switch
306 adder
307 memory
400 camera system
410 image pickup device
420 lens
430 drive circuit (DRV)
440 signal processing circuit (PRC)

The invention claimed is:

1. An image pickup device, comprising:
a plurality of pixels, wherein a pixel of the plurality of pixels is configured to output an electrical signal to an output signal line based on photon incidence;
a plurality of sense circuits, wherein a sense circuit of the plurality of sense circuits is configured to detect the electrical signal from the pixel; and
a drive section configured to read the electrical signal from the pixel,
wherein the sense circuit comprises a comparator configured to compare the electrical signal with a reference signal,
wherein the comparator comprises at least three capacitors configured to store the electrical signal, the reference signal and an offset signal,
wherein the offset signal is determined for the comparator by calibration, wherein, in the calibration:
a signal is supplied to each of an input section for the electrical signal and an input section for the reference signal,
a charge to cancel a difference between the electrical signal and the reference signal is held in at least one of the input section for the electrical signal of the comparator or the input section for the reference signal of the comparator, and
determine the offset signal for the comparator by a comparison of the electrical signal and the reference signal, wherein the electrical signal and the reference signal are compared while the offset signal is applied in a plurality of steps to one of the input section for the electrical signal of the comparator or the input section for the reference signal of the comparator.

2. The image pickup device according to claim 1, wherein the sense circuit is configured to:
measure a first inverting timing for the comparator by a sweep of a reference potential in steps, based on application of the offset signal,
measure, in a digital decision, a second inverting timing for the comparator by the sweep of the reference potential in the steps, and
derive light intensity from a difference between the first inverting timing and the second inverting timing.

3. The image pickup device according to claim 2, wherein the digital decision is a binary decision as to whether a photon is incident on the pixel.

4. The image pickup device according to claim 1, further comprising a decision result integrated circuit section configured to integrate decision results from the pixel to generate image pickup data with a gray scale.

5. A camera system, comprising:
an image pickup device;
an optical system configured to form an image of a subject on the image pickup device;
a signal processing circuit configured to process an output image signal of the image pickup device,
wherein the image pickup device comprises:
a plurality of pixels, wherein a pixel of the plurality of pixels is configured to output an electrical signal to an output signal line based on photon incidence;
a plurality of sense circuits, wherein a sense circuit of the plurality of sense circuits is configured to detect the electrical signal from the pixel; and
a drive section configured to read the electrical signal from the pixel,
wherein the sense circuit comprises a comparator configured to compare the electrical signal with a reference signal,
wherein the comparator comprises at least three capacitors configured to store the electrical signal, the reference signal and an offset signal,
wherein the offset signal is determined for the comparator by calibration,
wherein, in the calibration:
a signal is supplied to each of an input section for the electrical signal and an input section for the reference signal,
a charge to cancel a difference between the electrical signal and the reference signal is held in at least one of the input section for the electrical signal of the comparator or the input section for the reference signal of the comparator, and
determine the offset signal for the comparator by a comparison of the electrical signal and the reference signal, wherein the electrical signal and the reference signal are compared while the offset signal is applied in a plurality of steps to one of the input section for the electrical signal of the comparator or the input section for the reference signal of the comparator.

6. The camera system according to claim 5, wherein the sense circuit is configured to:
measure a first inverting timing for the comparator by a sweep of a reference potential in steps, based on application of the offset signal,
measure, in a digital decision, a second inverting timing for the comparator by the sweep of the reference potential in the steps, and
derive light intensity from a difference between the first inverting timing and the second inverting timing.

7. The camera system according to claim 6, wherein the digital decision is a binary decision as to whether a photon is incident on the pixel.

8. The camera system according to claim 5, further comprising a decision result integrated circuit section configured to integrate decision results from the pixel to generate image pickup data with a gray scale.

* * * * *